US010248524B2

(12) United States Patent
Rajwar et al.

(10) Patent No.: US 10,248,524 B2
(45) Date of Patent: *Apr. 2, 2019

(54) INSTRUCTION AND LOGIC TO TEST TRANSACTIONAL EXECUTION STATUS

(71) Applicant: Intel Corporation, Santa Clara, CA (US)

(72) Inventors: Ravi Rajwar, Portland, OR (US); Bret L. Toll, Hillsboro, OR (US); Konrad K. Lai, Vancouver, WA (US); Matthew C. Merten, Hillsboro, OR (US); Martin G. Dixon, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 119 days.

This patent is subject to a terminal disclaimer.

(21) Appl. No.: 14/998,055

(22) Filed: Dec. 24, 2015

(65) Prior Publication Data

US 2016/0266992 A1 Sep. 15, 2016

Related U.S. Application Data

(63) Continuation of application No. 14/977,659, filed on Dec. 22, 2015, which is a continuation of application (Continued)

(51) Int. Cl.
*G06F 15/00* (2006.01)
*G06F 7/38* (2006.01)
(Continued)

(52) U.S. Cl.
CPC ............ *G06F 11/28* (2013.01); *G06F 9/3009* (2013.01); *G06F 9/3016* (2013.01); (Continued)

(58) Field of Classification Search
CPC ........ G06F 9/3842; G06F 9/467; G06F 9/466; G06F 9/30076; G06F 9/30087; (Continued)

(56) References Cited

U.S. PATENT DOCUMENTS 5,428,761 A 6/1995 Herlihy et al.
5,701,432 A 12/1997 Wong et al.
(Continued)

FOREIGN PATENT DOCUMENTS

CN 101095113 A 12/2007
CN 101187861 A 5/2008
(Continued)

OTHER PUBLICATIONS

Akkary, "Checkpoint Processing and Recovery: Towards Scalable Large Instruction WindoW Processors," Proceedings of the 36th International Symposium on Microarchitecture (Micro-36 2003), IEEE 07695-2043-X/03, 12 pages.
(Continued)

*Primary Examiner* — Chun Kuan Lee
(74) *Attorney, Agent, or Firm* — Lowenstein Sandler LLP

(57) ABSTRACT

Novel instructions, logic, methods and apparatus are disclosed to test transactional execution status. Embodiments include decoding a first instruction to start a transactional region. Responsive to the first instruction, a checkpoint for a set of architecture state registers is generated and memory accesses from a processing element in the transactional region associated with the first instruction are tracked. A second instruction to detect transactional execution of the transactional region is then decoded. An operation is executed, responsive to decoding the second instruction, to determine if an execution context of the second instruction is within the transactional region. Then responsive to the second instruction, a first flag is updated. In some embodi-
(Continued)

ments, a register may optionally be updated and/or a second flag may optionally be updated responsive to the second instruction.

12 Claims, 18 Drawing Sheets

Related U.S. Application Data

No. 13/538,951, filed on Jun. 29, 2012, now Pat. No. 9,268,596, which is a continuation-in-part of application No. PCT/US2012/023611, filed on Feb. 2, 2012.

(51) Int. Cl.

| | |
|---|---|
| *G06F 9/00* | (2006.01) |
| *G06F 9/44* | (2018.01) |
| *G06F 11/28* | (2006.01) |
| *G06F 9/46* | (2006.01) |
| *G06F 9/30* | (2018.01) |
| *G06F 12/0811* | (2016.01) |
| *G06F 9/38* | (2018.01) |
| *G11C 7/10* | (2006.01) |
| *G06F 11/22* | (2006.01) |
| *G06F 11/263* | (2006.01) |
| *G06F 12/0897* | (2016.01) |
| *G06F 12/0817* | (2016.01) |
| *G06F 12/084* | (2016.01) |
| *G06F 12/0862* | (2016.01) |
| *G06F 12/0875* | (2016.01) |
| *G06F 11/14* | (2006.01) |
| *G06F 11/25* | (2006.01) |

(52) U.S. Cl.
CPC ...... *G06F 9/30047* (2013.01); *G06F 9/30076* (2013.01); *G06F 9/30087* (2013.01); *G06F 9/30098* (2013.01); *G06F 9/30145* (2013.01); *G06F 9/3802* (2013.01); *G06F 9/384* (2013.01); *G06F 9/3834* (2013.01); *G06F 9/3842* (2013.01); *G06F 9/466* (2013.01); *G06F 9/467* (2013.01); *G06F 11/1407* (2013.01); *G06F 11/2236* (2013.01); *G06F 11/25* (2013.01); *G06F 11/263* (2013.01); *G06F 12/084* (2013.01); *G06F 12/0811* (2013.01); *G06F 12/0828* (2013.01); *G06F 12/0862* (2013.01); *G06F 12/0875* (2013.01); *G06F 12/0897* (2013.01); *G11C 7/1072* (2013.01); *G06F 2212/1032* (2013.01); *G06F 2212/20* (2013.01); *G06F 2212/283* (2013.01); *G06F 2212/314* (2013.01); *G06F 2212/452* (2013.01); *G06F 2212/602* (2013.01); *G06F 2212/608* (2013.01); *G06F 2212/621* (2013.01)

(58) Field of Classification Search
CPC .. G06F 9/3834; G06F 9/3802; G06F 9/30098; G06F 11/263; G06F 12/0897; G06F 11/2236; G06F 9/30145; G06F 9/384; G06F 9/3016; G06F 12/0811; G06F 9/30047; G06F 12/0875; G06F 12/0862; G06F 12/084; G06F 12/0828; G11C 7/1072
USPC ...................................................... 712/227
See application file for complete search history.

(56) References Cited

U.S. PATENT DOCUMENTS

| | | |
|---|---|---|
| 5,742,785 A | 4/1998 | Stone et al. |
| 5,758,051 A | 5/1998 | Moreno et al. |
| 5,835,764 A | 11/1998 | Platt et al. |
| 5,918,005 A | 6/1999 | Moreno et al. |
| 5,940,827 A | 8/1999 | Hapner et al. |
| 5,974,438 A | 10/1999 | Neufeld |
| 6,021,480 A | 2/2000 | Pettey |
| 6,185,577 B1 | 2/2001 | Nainani et al. |
| 6,360,220 B1 | 3/2002 | Forin |
| 6,460,124 B1 | 10/2002 | Kagi et al. |
| 6,578,033 B1 | 6/2003 | Singhal et al. |
| 6,681,311 B2 | 1/2004 | Gaskins et al. |
| 6,918,012 B2 | 7/2005 | Venkitakrishnan et al. |
| 6,941,449 B2 | 9/2005 | Ross |
| 7,089,374 B2 | 8/2006 | Tremblay et al. |
| 7,120,762 B2 | 10/2006 | Rajwar et al. |
| 7,206,903 B1 * | 4/2007 | Moir ................... G06F 12/0842 711/130 |
| 7,269,694 B2 | 9/2007 | Tremblay et al. |
| 8,407,455 B2 | 3/2013 | Christie et al. |
| 2002/0087810 A1 | 7/2002 | Boatright et al. |
| 2002/0178349 A1 | 11/2002 | Shibayama et al. |
| 2003/0066056 A1 | 4/2003 | Petersen et al. |
| 2003/0079094 A1 | 4/2003 | Rajwar et al. |
| 2004/0162948 A1 | 8/2004 | Tremblay et al. |
| 2004/0186970 A1 | 9/2004 | Kekre et al. |
| 2007/0136289 A1 | 6/2007 | Adl-Tabatabai et al. |
| 2008/0071851 A1 | 3/2008 | Zohar et al. |
| 2010/0023703 A1 | 1/2010 | Christie et al. |
| 2010/0146513 A1 | 6/2010 | Song |
| 2010/0146613 A1 | 6/2010 | Song |
| 2010/0205408 A1 * | 8/2010 | Chung .................... G06F 9/466 712/216 |
| 2010/0299508 A1 * | 11/2010 | Luttrell ................. G06F 9/3824 712/234 |
| 2011/0153960 A1 | 6/2011 | Rajwar et al. |
| 2011/0208921 A1 | 8/2011 | Pohlack et al. |
| 2011/0252203 A1 | 10/2011 | Kottapalli et al. |
| 2012/0079246 A1 | 3/2012 | Breternitz, Jr. et al. |
| 2012/0117334 A1 | 5/2012 | Sheaffer et al. |
| 2012/0117362 A1 * | 5/2012 | Bhargava ................ G06F 9/381 712/239 |
| 2012/0159074 A1 | 6/2012 | Sodhi et al. |

FOREIGN PATENT DOCUMENTS

| | | |
|---|---|---|
| CN | 101448255 | 5/2008 |
| CN | 101187862 | 6/2009 |
| CN | 101770397 A | 7/2010 |
| CN | 102144218 A | 8/2011 |
| CN | 102163072 A | 8/2011 |
| WO | WO0193028 A2 | 12/2001 |
| WO | WO03054693 A1 | 7/2003 |

OTHER PUBLICATIONS

Bodorik, "Multi-View Memory Support to Operating Systems in Locking for Transaction and Database Systems", Abstract, http://comjnl.oxfordjournals.org/content/41/2/84, Feb. 13, 1998, 1 page.
Cintra, "Toward Efficient and Robust Software Speculative Parallelization on Multiprocessors", Principles and Practice of Parallel Programming 2003, Conference Paper—Jan. 2003, San Diego, CA: ACM 1-58113-588-2/03/0006, 13 pages.
Gray, "The Transaction Concept: Virtues and Limitations", Proceedings of Seventh International Conference on Very Large Databases, Sep. 1981, Tandem Computers Incorporated, 30 pages.
Herlihy, "Transactional Memory: Architectural Support for Lock-Free Data Structures", ISCA Proceedings of the 20th Annual International Symposium on Computer Architecture (ACM New York 1993), 12 Pages.
Martinez, "Speculative Locks for Concurrent Execution of Critical Sections in Shared-Memory Multiprocessors", Workshop on Memory

(56) References Cited

OTHER PUBLICATIONS

Performance Issues, International Symposium on Computer Architecture, Jun. 2001, 8 pages.
Martinez, "Speculative Synchronization: Applying Thread-Level Speculation to Explicitly Parallel Applications", Proceedings of the Tenth International Conference on Architectural Support for Programming Languages and Operating Systems (ASPLOS), Oct. 6-9, 2002, San Jose CA, 12 pages.
McDonald, A. et al. Architectural semantics for practical transactional memory, in: the 33rd international symposium on computer architecture, pp. 53-65, IEEE computer society Washington, DC. USA, 2006 (retrieved from http://arsenalfc.stanford.edu/papers/tcc_isca2006.pdf).
Oplinger, "Enhancing Software Reliability with Speculative Threads", Computer Systems Laboratory, Stanford University, ASPLOS X Proceedings of the 10th International Conference on Architectural Support for Programming Languages and Operating Systems, ACM New Your 2002, 13 pages.
Rajwar, "Improving the Throughput of Synchronization by Insertion of Delays", Proceedings of the Sixth International Symposium on High-Performance Computer Architecture (HPCA 2000), Jan. 10-12, 2000, Toulouse, France, 12 pages.
Rajwar, "Speculation-Based Techniques for Transactional Lock-Free Execution of Lock-Based Programs", A Dissertation Submitted in Partial Fulfillment of the Requirements for the Degree of Doctor of Philosophy (Computer Science), University of Wisconsin—Madison, 2002, 224 pages.
Rajwar, "Speculative Lock Elision: Enabling Highly Concurrent Multithreaded Execution", Proceedings of the 34th Annual International Symposium on Microarchitecture (Micro), Dec. 3-5, 2001, Austin TX, 12 pages.
Rajwar, "Transactional Execution: Toward Reliable, High-Performance Multithreading", IEEE Micro, Nov.-Dec. 2003, pp. 117-125.
Rajwar, "Transactional Lock-Free Execution of Lock-Based Programs", Proceedings of the Tenth International Conference on Architectural Support for Programming Languages and Operating Systems (ASPLOS), Oct. 6-9, 2002, San Jose CA, 13 pages.
Steffan, "The Potential for Using Thread-Level Data Speculation to Facilitate Automatic Parallelization", HPCA '98 Proceedings of the 4th International Symposium on High-Performance Computer Architecture, 1998, 12 pages.
Stone, "Multiple Reservations and the Oklahoma Update", IEEE Paralleled & Distributed Technology, Nov. 1993, 14 pages.
International Search Report and Written Opinion for PCT/US2013/046633 dated Sep. 27, 2013.
International Search Report and Written Opinion for PCT/US2012/023611 dated Nov. 1, 2012.

\* cited by examiner

INSTRUCTION AND LOGIC TO TEST TRANSACTIONAL EXECUTION STATUS

RELATED APPLICATIONS

This is a Continuation of application Ser. No. 14/977,659, filed Dec. 22, 2015, currently pending, which is a Continuation of application Ser. No. 13/538,951, filed Jun. 29, 2012, currently pending, which is a Continuation-in-part of International Application No. PCT/US2012/023611 designating the United States, and filed Feb. 2, 2012. This prior international application is incorporated herein by reference as if set forth in its entirety.

FIELD OF THE DISCLOSURE

This disclosure relates generally to the fields of processing logic, microprocessors, and associated instruction set architecture that, when executed by the processor or other processing logic, perform logical, mathematical, or other functional operations. In particular, the disclosure relates to instructions and logic to test transactional execution status.

BACKGROUND OF THE DISCLOSURE

Advances in semi-conductor processing and logic design have permitted an increase in the amount of logic that may be present on integrated circuit devices. As a result, computer system configurations have evolved from a single or multiple integrated circuits in a system to multiple processing cores and multiple logical processors present on individual integrated circuits. A processor or integrated circuit typically comprises a single processor die, where the processor die may include any number of cores or logical processors.

The ever increasing number of cores and logical processors on integrated circuits enables more software threads to be concurrently executed. However, the increase in the number of software threads that may be executed simultaneously have created problems with synchronizing data shared among the software threads. One common solution to accessing shared data in multiple core or multiple logical processor systems comprises the use of locks to guarantee mutual exclusion across multiple accesses to shared data. However, the ever increasing ability to execute multiple software threads creates a bottleneck on the locked data, causing threads to wait for other threads to complete (serializing their execution), reducing the benefit of having multiple threads executing concurrently. Furthermore, some read-only accesses may use a lock to guarantee mutual exclusion of the data in case a writer attempts to modify the data, which has an undesirable side effect of locking out other read-only accesses.

For example, consider a hash table holding shared data. With a lock system, a programmer may lock the entire hash table, allowing one thread to access the entire hash table. However, throughput and performance of other threads is potentially adversely affected, as they are unable to access any entries in the hash table, until the lock is released. Alternatively, each entry in the hash table may be locked, leading to many locks structures in the software. In such a construct, many locks might need to be acquired to execute a particular task, which may lead to deadlocks with other threads. Either way, after extrapolating this simple example into a large scalable program, it is apparent that the complexity of lock contention, serialization, fine-grain synchronization, and deadlock avoidance become extremely cumbersome burdens for programmers.

Another recent data synchronization technique includes the use of transactional memory (TM). Often transactional execution includes executing a grouping of a plurality of micro-operations, operations, or instructions atomically. In the example above, both threads execute within the hash table, and their memory accesses are monitored/tracked. If both threads access/alter the same entry, conflict resolution may be performed to ensure data validity. One type of transactional execution includes Software Transactional Memory (STM), where tracking of memory accesses, conflict resolution, abort tasks, and other transactional tasks are performed in software, often without the support of hardware. Another type of transactional execution includes a Hardware Transactional Memory (HTM) System, where hardware is included to support access tracking, conflict resolution, and other transactional tasks.

A technique similar to transactional memory includes hardware lock elision (HLE), where a locked critical section is executed tentatively without the locks. And if the execution is successful (i.e. no conflicts), then the results are made globally visible. In other words, the critical section is executed like a transaction with the lock instructions from the critical section being elided, instead of executing an atomically defined transaction. As a result, in the example above, instead of replacing the hash table execution with a transaction, the critical section defined by the lock instructions are executed tentatively. Multiple threads similarly execute within the hash table, and their accesses are monitored/tracked. If any of the threads access/alter the same entry, conflict resolution may be performed to ensure data validity. But if no conflicts are detected, the updates to the hash table are atomically committed.

As can be seen, transactional execution and lock elision have the potential to provide better performance among multiple threads. However, HLE and TM are relatively new fields of study with regards to microprocessors. And as a result, HLE and TM implementations in processors have not bee fully explored or detailed.

BRIEF DESCRIPTION OF THE DRAWINGS

The present invention is illustrated by way of example and not limitation in the figures of the accompanying drawings.

DETAILED DESCRIPTION

Figure 1:
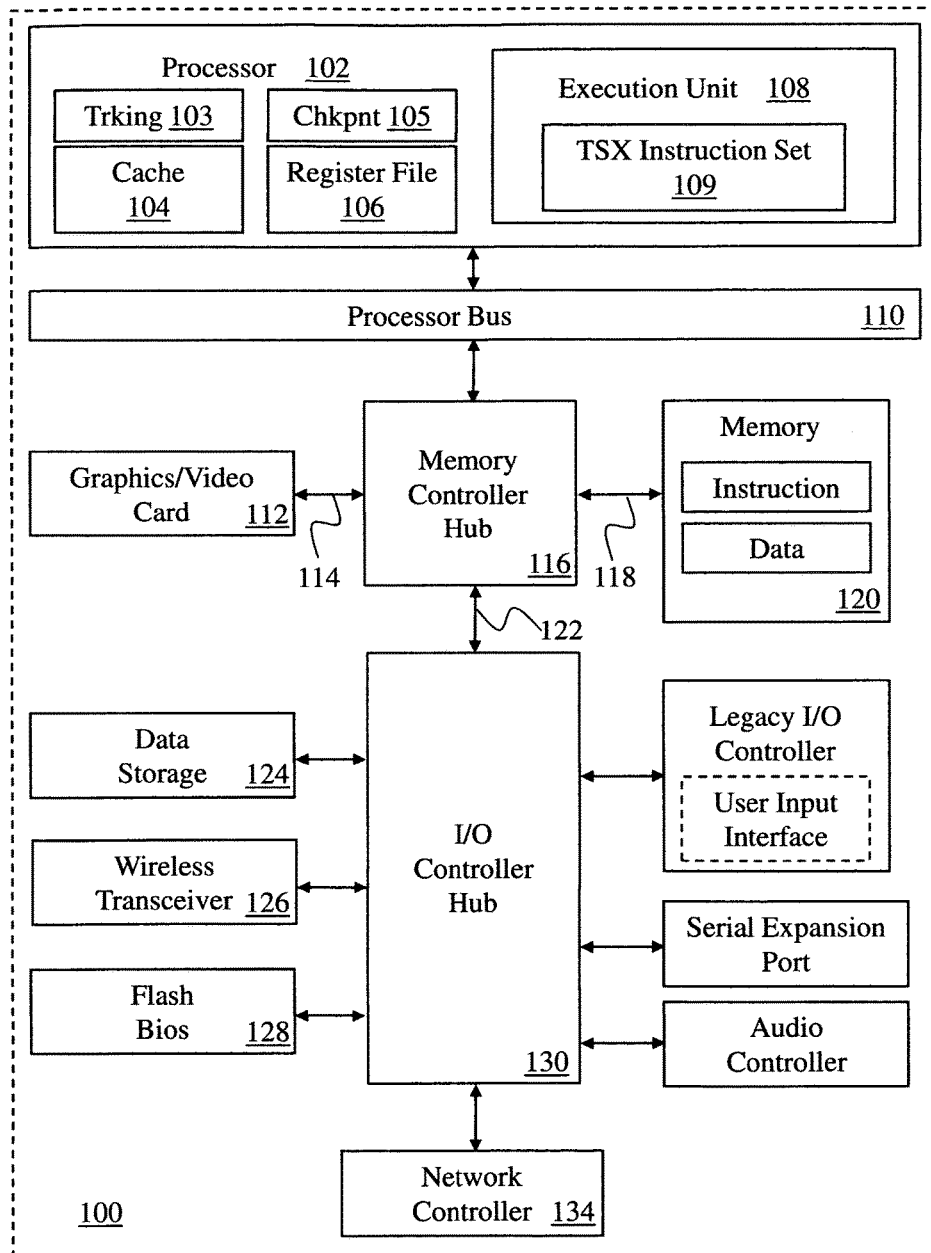
FIG. 1 illustrates one embodiment of a computing system for using instructions and logic to test transactional execution status.

Some embodiments of the herein disclosed instructions and logic to test transactional execution status may be implemented in conjunction with a processor Instruction Set Architecture (ISA) Transactional Synchronization Extensions (TSX). Such extensions may provide capabilities to dynamically detect when serialization through lock-protected critical sections is necessary in a multi-threaded software environment. Programmer-specified code regions (referred to as transactional regions) may execute transactionally. If the transactional execution completes successfully (i.e. without contention from another process or thread) then all memory operations, or modifications of data in memory, will appear to have taken place atomically or instantaneously upon the successful completion and exit from the transactional region.

Hardware Lock Elison (HLE) is one embodiment of such an extension which provides an instruction set interface for programmers using two instruction prefix hints, XAQUIRE and XRELEASE, to specify transactional regions around the acquisition and release of locks that protect critical sections. With HLE a processor may elide the write associated with the lock and attempt to execute the region transactionally. If the processor detects any data conflicts, a transactional abort will be performed and the critical section will be re-executed non-transactionally and without elision.

Restricted Transactional Memory (RTM) is another embodiment of an instruction set interface for programmers using three instructions, XBEGIN and XEND, to specify transactional regions, and XABORT to explicitly abort the execution of an RTM region. The XBEGIN instruction may also specify a branch to a relative offset as a fallback code section to be executed in the case of a transactional abort. The fallback code may contain conflict resolution steps. The explicit XABORT may also specify an 8-bit immediate value to be written into a register, e.g. for use by the fallback code section. Embodiments of the herein disclosed instructions and logic to test transactional execution status, may also be implemented in conjunction with other processor ISA transactional extensions, and/or with HTM, and/or with STM, and/or with other transactional execution contexts.

Novel instructions, logic, methods and apparatus are disclosed herein to test transactional execution status. Embodiments include decoding a first instruction or prefix to start a transactional region. Responsive to the first instruction or prefix, a checkpoint for a set of architecture state registers is generated and memory accesses from a processing element in the transactional region associated with the first instruction are tracked. In one embodiment an instruction set interface for programmers may include a second instruction to test a transactional status, wherein the second instruction is executed to determine if the execution context is within a transactional region, or speculative transactional critical section such as, for example, HLE or RTM. In one embodiment, such an instruction may be used to set a flag register to one value (e.g. zero) if is determined that the instruction is being executed inside a transactional region. In one embodiment, such an instruction may be used to set a flag register to another value (e.g. one) if is determined that the instruction is not being executed inside a transactional region. In one alternative embodiment, such an instruction may be used to set a register to a value indicative of a nesting level of a potentially transactional region. In another alternative embodiment, such an instruction may be used to determine if accessing memory associated with a memory operand could cause a transactional abort of a potentially transactional region. In another alternative embodiment, such an instruction may be used to determine if sufficient buffering is available for transactional execution of a potentially transactional region. Other alternative embodiments are also possible.

It will be appreciated that by using one embodiment of such an instruction the programmer may dynamically determine inside a potentially transactional region, e.g. such as an HLE region, if that region is being executed transactionally, or for example, if the region is being re-executed non-transactionally following a transactional abort. Using one embodiment of such an instruction the programmer may dynamically determine inside a potentially transactional region, e.g. such as an RTM region, if an XABORT instruction will restore a previous architectural state, or will be treated as a NOP (i.e. no operation). Using one embodiment of such an instruction the programmer may dynamically determine if a library routine was called from within a transactional region, or from a fallback code section. It will be appreciated that by using one embodiment of such an instruction the programmer may dynamically determine if the nesting level of a transactional region may be close to the hardware limit and if further nesting would potentially cause a transactional abort.

In the following description, numerous specific details such as processing logic, processor types, micro-architectural conditions, events, enablement mechanisms, and the like are set forth in order to provide a more thorough understanding of embodiments of the present invention. It will be appreciated, however, by one skilled in the art that the invention may be practiced without such specific details. Additionally, some well known structures, circuits, and the like have not been shown in detail to avoid unnecessarily obscuring embodiments of the present invention.

These and other embodiments of the present invention may be realized in accordance with the following teachings and it should be evident that various modifications and changes may be made in the following teachings without departing from the broader spirit and scope of the invention. The specification and drawings are, accordingly, to be regarded in an illustrative rather than restrictive sense and the invention measured only in terms of the claims and their equivalents.

FIG. 1 illustrates one embodiment of a computing system 100 for using instructions and logic to test transactional execution status. System 100 includes a component, such as a processor 102 to employ execution units including logic to perform algorithms for process data, in accordance with the present invention, such as in the embodiment described herein. System 100 is representative of processing systems based on the PENTIUM® III, PENTIUM® 4, Xeon™, Itanium®, XScale™ and/or StrongARM™ microprocessors available from Intel Corporation of Santa Clara, Calif., although other systems (including PCs having other microprocessors, engineering workstations, set-top boxes and the like) may also be used. In one embodiment, sample system 100 may execute a version of the WINDOWS™ operating system available from Microsoft Corporation of Redmond, Wash., although other operating systems (UNIX and Linux for example), embedded software, and/or graphical user interfaces, may also be used. Thus, embodiments of the present invention are not limited to any specific combination of hardware circuitry and software.

Embodiments are not limited to computer systems. Alternative embodiments of the present invention can be used in other devices such as handheld devices and embedded applications. Some examples of handheld devices include cellular phones, Internet Protocol devices, digital cameras, personal digital assistants (PDAs), and handheld PCs. Embedded applications can include a micro controller, a digital signal processor (DSP), system on a chip, network computers (NetPC), set-top boxes, network hubs, wide area network (WAN) switches, or any other system that can perform one or more instructions in accordance with at least one embodiment.

FIG. 1 is a block diagram of a computer system 100 formed with a processor 102 that includes one or more execution units 108 to perform an algorithm to perform at least one instruction in accordance with one embodiment of the present invention. One embodiment may be described in the context of a single processor desktop or server system, but alternative embodiments can be included in a multiprocessor system. System 100 is an example of a 'hub' system architecture. The computer system 100 includes a processor 102 to process data signals. The processor 102 can be a complex instruction set computer (CISC) microprocessor, a reduced instruction set computing (RISC) microprocessor, a very long instruction word (VLIW) microprocessor, a processor implementing a combination of instruction sets, or any other processor device, such as a digital signal processor, for example. The processor 102 is coupled to a processor bus 110 that can transmit data signals between the processor 102 and other components in the system 100. The elements of system 100 perform their conventional functions that are well known to those familiar with the art.

In one embodiment, the processor 102 includes a Level 1 (L1) internal cache memory 104. Depending on the architecture, the processor 102 can have a single internal cache or multiple levels of internal cache. Alternatively, in another embodiment, the cache memory can reside external to the processor 102. Other embodiments can also include a combination of both internal and external caches depending on the particular implementation and needs. Register file 106 can store different types of data in various registers including integer registers, floating point registers, status registers, and instruction pointer register. Checkpoint logic 105 is provided to checkpoint the set of architecture state registers in register file 106 for threads executed by thread processing elements of processor 102. Tracking logic 103 is provided to track memory accesses from thread processing elements associated with transactional regions of shared memory in cache memory 104.

Execution unit 108, including logic to perform integer and floating point operations, also resides in the processor 102. The processor 102 also includes a microcode (ucode) ROM that stores microcode for certain macroinstructions. For one embodiment, execution unit 108 includes logic to handle a transactional synchronization extensions (TSX) instruction set 109 including one or more instructions to test transactional execution status. By including the TSX instruction set 109 in the instruction set of a general-purpose processor 102, along with associated circuitry to execute the instructions, the operations used by many multithreaded applications may be performed using restricted transactional memory or hardware lock elision in a general-purpose processor 102. Thus, many multithreaded applications can be accelerated and executed more efficiently by using the restricted transactional memory or hardware lock elision for performing synchronization on shared data. This can eliminate the need to perform unnecessary synchronization on critical sections of shared memory that have relatively few conflicts.

Alternate embodiments of an execution unit 108 can also be used in micro controllers, embedded processors, graphics devices, DSPs, and other types of logic circuits. System 100 includes a memory 120. Memory 120 can be a dynamic random access memory (DRAM) device, a static random access memory (SRAM) device, flash memory device, or other memory device. Memory 120 can store instructions and/or data represented by data signals that can be executed by the processor 102.

A system logic chip 116 is coupled to the processor bus 110 and memory 120. The system logic chip 116 in the illustrated embodiment is a memory controller hub (MCH). The processor 102 can communicate to the MCH 116 via a processor bus 110. The MCH 116 provides a high bandwidth memory path 118 to memory 120 for instruction and data storage and for storage of graphics commands, data and textures. The MCH 116 is to direct data signals between the processor 102, memory 120, and other components in the system 100 and to bridge the data signals between processor bus 110, memory 120, and system I/O 122. In some embodiments, the system logic chip 116 can provide a graphics port for coupling to a graphics controller 112. The MCH 116 is coupled to memory 120 through a memory interface 118.

The graphics card 112 is coupled to the MCH 116 through an Accelerated Graphics Port (AGP) interconnect 114.

System 100 uses a proprietary hub interface bus 122 to couple the MCH 116 to the I/O controller hub (ICH) 130. The ICH 130 provides direct connections to some I/O devices via a local I/O bus. The local I/O bus is a high-speed I/O bus for connecting peripherals to the memory 120, chipset, and processor 102. Some examples are the audio controller, firmware hub (flash BIOS) 128, wireless transceiver 126, data storage 124, legacy I/O controller containing user input and keyboard interfaces, a serial expansion port such as Universal Serial Bus (USB), and a network controller 134. The data storage device 124 can comprise a hard disk drive, a floppy disk drive, a CD-ROM device, a flash memory device, or other mass storage device.

For another embodiment of a system, an instruction in accordance with one embodiment can be used with a system on a chip. One embodiment of a system on a chip comprises of a processor and a memory. The memory for one such system is a flash memory. The flash memory can be located on the same die as the processor and other system components. Additionally, other logic blocks such as a memory controller or graphics controller can also be located on a system on a chip.

Figure 2:
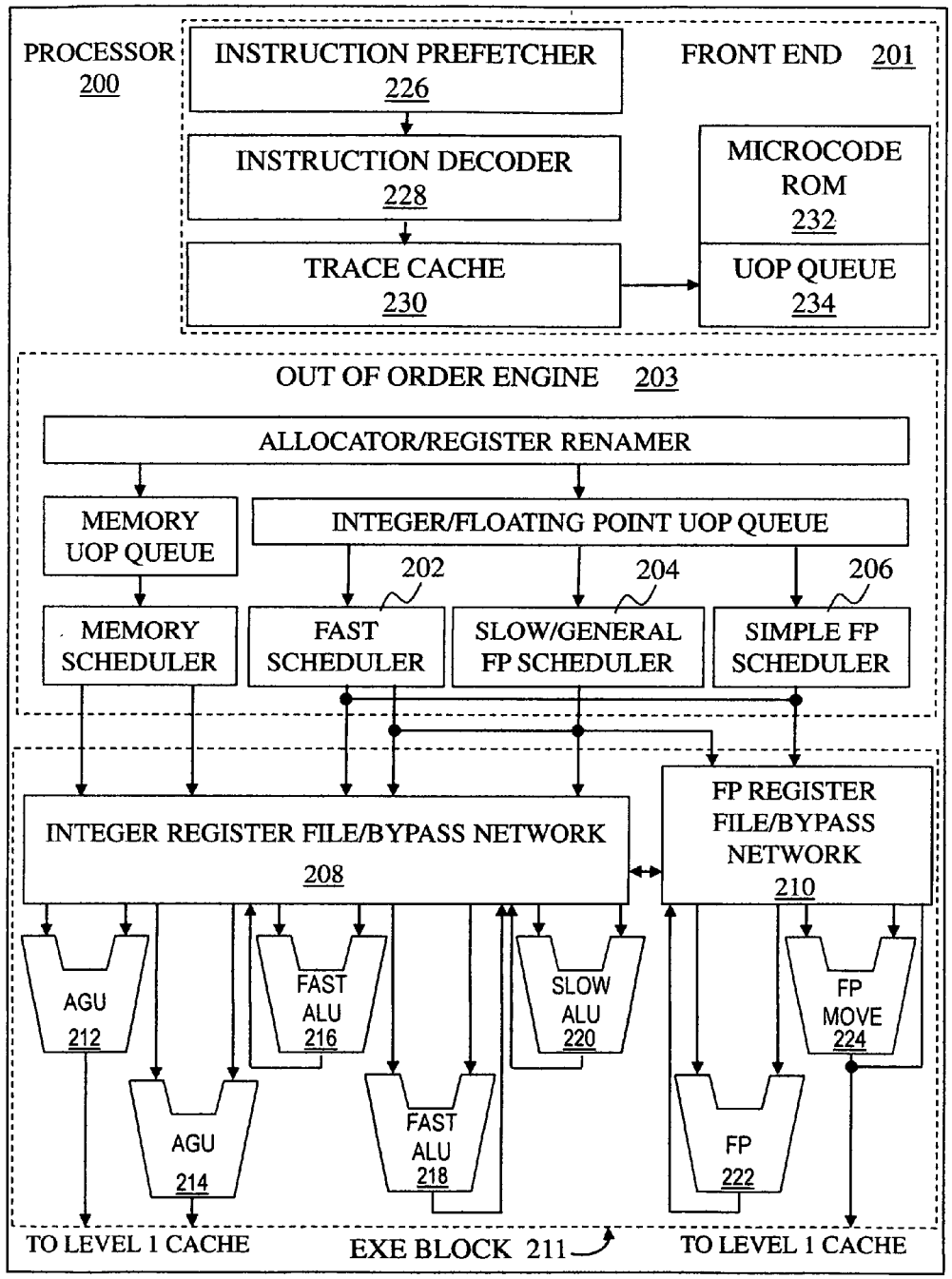
FIG. 2 illustrates one embodiment of a processor for using instructions and logic to test transactional execution status.

FIG. 2 illustrates one embodiment of a processor 200 for using instructions and logic to test transactional execution status. In some embodiments, an instruction in accordance with one embodiment can be implemented to operate on data elements having sizes of byte, word, doubleword, quadword, etc., as well as datatypes, such as single and double precision integer and floating point datatypes. In one embodiment the in-order front end 201 is the part of the processor 200 that fetches instructions to be executed and prepares them to be used later in the processor pipeline. The front end 201 may include several units. In one embodiment, the instruction prefetcher 226 fetches instructions from memory and feeds them to an instruction decoder 228 which in turn decodes or interprets them. For example, in one embodiment, the decoder decodes a received instruction into one or more operations called "micro-instructions" or "micro-operations" (also called micro ops or uops) that the machine can execute. In other embodiments, the decoder parses the instruction into an opcode and corresponding data and control fields that are used by the micro-architecture to perform operations in accordance with one embodiment. In one embodiment including a trace cache 230, the trace cache 230 takes decoded uops and assembles them into program ordered sequences or traces in the uop queue 234 for execution. When the trace cache 230 encounters a complex instruction, the microcode ROM 232 provides the uops needed to complete the operation.

Some instructions are converted into a single micro-op, whereas others need several micro-ops to complete the full operation. In one embodiment, if more than four micro-ops are needed to complete an instruction, the decoder 228 accesses the microcode ROM 232 to do the instruction. For one embodiment, an instruction can be decoded into a small number of micro ops for processing at the instruction decoder 228. In another embodiment, an instruction can be stored within the microcode ROM 232 should a number of micro-ops be needed to accomplish the operation. The trace cache 230 refers to a entry point programmable logic array (PLA) to determine a correct micro-instruction pointer for reading the micro-code sequences to complete one or more instructions in accordance with one embodiment from the micro-code ROM 232. After the microcode ROM 232 finishes sequencing micro-ops for an instruction, the front end 201 of the machine resumes fetching micro-ops from the trace cache 230. It will be appreciated that the inclusion of a trace cache 230 is not necessary for all embodiments.

The out-of-order execution engine 203 is where the instructions are prepared for execution. The out-of-order execution logic has a number of buffers to smooth out and re-order the flow of instructions to optimize performance as they go down the pipeline and get scheduled for execution. The allocator logic allocates the machine buffers and resources that each uop needs in order to execute. The register renaming logic renames logic registers onto entries in a register file. The allocator also allocates an entry for each uop in one of the two uop queues, one for memory operations and one for non-memory operations, in front of the instruction schedulers: memory scheduler, fast scheduler 202, slow/general floating point scheduler 204, and simple floating point scheduler 206. The uop schedulers 202, 204, 206, determine when a uop is ready to execute based on the readiness of their dependent input register operand sources and the availability of the execution resources the uops need to complete their operation. The fast scheduler 202 of one embodiment can schedule on each half of the main clock cycle while the other schedulers can only schedule once per main processor clock cycle. The schedulers arbitrate for the dispatch ports to schedule uops for execution.

Register files 208, 210, sit between the schedulers 202, 204, 206, and the execution units 212, 214, 216, 218, 220, 222, 224 in the execution block 211. There is a separate register file 208, 210, for integer and floating point operations, respectively. Each register file 208, 210, of one embodiment also includes a bypass network that can bypass or forward just completed results that have not yet been written into the register file to new dependent uops. The integer register file 208 and the floating point register file 210 are also capable of communicating data with the other. For one embodiment, the integer register file 208 is split into two separate register files, one register file for the low order 32 bits of data and a second register file for the high order 32 bits of data. The floating point register file 210 of one embodiment has 128 bit wide entries because floating point instructions typically have operands from 64 to 128 bits in width. Some embodiments of floating point register file 210 may have 256 bit wide, or 512 bit wide, or some other width entries. For some embodiments, in the floating point register file 210, each element may be separately written to at boundaries of 64 bits, 32 bits, 16 bits, etc.

The execution block 211 contains the execution units 212, 214, 216, 218, 220, 222, 224, where the instructions are actually executed. This section includes the register files 208, 210, that store the integer and floating point data operand values that the micro-instructions need to execute. The processor 200 of one embodiment is comprised of a number of execution units: address generation unit (AGU) 212, AGU 214, fast ALU 216, fast ALU 218, slow ALU 220, floating point ALU 222, floating point move unit 224. For one embodiment, the floating point execution blocks 222, 224, execute floating point, MMX, SIMD, SSE and AVX, or other operations. The floating point ALU 222 of one embodiment includes a 64 bit by 64 bit floating point divider to execute divide, square root, and remainder micro-ops. For embodiments of the present invention, instructions involving a floating point value may be handled with the floating point hardware. In one embodiment, the ALU operations go to the high-speed ALU execution units 216, 218. The fast ALUs 216, 218, of one embodiment can execute fast operations with an effective latency of half a clock cycle. For one embodiment, most complex integer operations go to the slow ALU 220 as the slow ALU 220 includes integer execution hardware for long latency type of operations, such as a multiplier, shifts, flag logic, and branch processing. Memory load/store operations are executed by the AGUs 212, 214. For one embodiment, the integer ALUs 216, 218, 220, are described in the context of performing integer operations on 64 bit data operands. In alternative embodiments, the ALUs 216, 218, 220, can be implemented to support a variety of data bits including 16, 32, 128, 256, etc. Similarly, the floating point units 222, 224, can be implemented to support a range of operands having bits of various widths. For one embodiment, the floating point units 222, 224, can operate on 128 bits wide packed data operands in conjunction with SIMD and multimedia instructions.

In one embodiment, the uops schedulers 202, 204, 206, dispatch dependent operations before the parent load has finished executing. As uops are speculatively scheduled and executed in processor 200, the processor 200 also includes logic to handle memory misses. If a data load misses in the data cache, there can be dependent operations in flight in the pipeline that have left the scheduler with temporarily incorrect data. In some embodiments, a replay mechanism may track and re-execute instructions that use incorrect data. Only the dependent operations need to be replayed and the independent ones are allowed to complete. The schedulers and replay mechanism of one embodiment of a processor are also designed to catch instructions that provide functionality for testing transactional execution status. In some alternative embodiments without a replay mechanism, speculative execution of uops may be prevented and dependent uops may reside in the schedulers 202, 204, 206 until they are canceled, or until they cannot be canceled.

The term "registers" may refer to the on-board processor storage locations that are used as part of instructions to identify operands. In other words, registers may be those that are usable from the outside of the processor (from a programmer's perspective). However, the registers of an embodiment should not be limited in meaning to a particular type of circuit. Rather, a register of an embodiment is capable of storing and providing data, and performing the functions described herein. The registers described herein can be implemented by circuitry within a processor using any number of different techniques, such as dedicated physical registers, dynamically allocated physical registers using register renaming, combinations of dedicated and dynamically allocated physical registers, etc. In one embodiment, integer registers store thirty-two bit integer data. A register file of one embodiment also contains eight multimedia SIMD registers for packed data. For the discussions below, the registers are understood to be data registers designed to hold packed data, such as 64 bits wide MMX™ registers (also referred to as 'mm' registers in some instances) in microprocessors enabled with MMX technology from Intel Corporation of Santa Clara, Calif. These MMX registers, available in both integer and floating point forms, can operate with packed data elements that accompany SIMD and SSE instructions. The, 128 bits wide XMM registers relating to SSE2, SSE3, SSE4 (referred to generically as "SSEx") technology can also be used to hold such packed data operands. Similarly, 256 bits wide YMM registers and 512 bits wide ZMM registers relating to AVX, AVX2, AVX3 technology (or beyond) may overlap with XMM registers and can be used to hold such wider packed data operands. In one embodiment, in storing packed data and integer data, the registers do not need to differentiate between the two data types. In one embodiment, integer and floating point are either contained in the same register file or different register files. Furthermore, in one embodiment, floating point and integer data may be stored in different registers or the same registers.

Figure 3A:
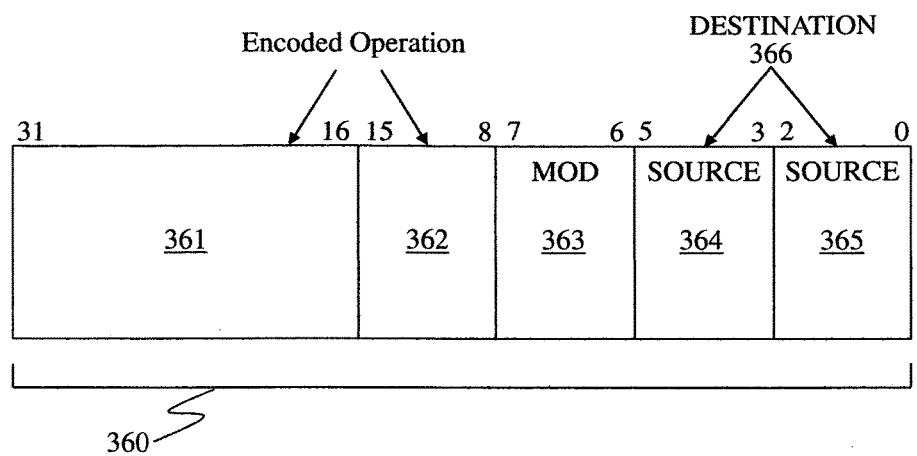
FIG. 3A illustrates an instruction encoding to provide functionality for testing transactional execution status according to one embodiment.

FIG. 3A is a depiction of one embodiment of an operation encoding (opcode) format 360, having thirty-two or more bits, and register/memory operand addressing modes corresponding with a type of opcode format described in the "Intel® 64 and IA-32 Intel Architecture Software Developer's Manual Combined Volumes 2A and 2B: Instruction Set Reference A-Z," which is which is available from Intel Corporation, Santa Clara, Calif. on the world-wide-web (www) at intel.com/products/processor/manuals/. In one embodiment, and instruction may be encoded by one or more of fields 361 and 362. Up to two operand locations per instruction may be identified, including up to two source operand identifiers 364 and 365. For one embodiment, destination operand identifier 366 is the same as source operand identifier 364, whereas in other embodiments they are different. For an alternative embodiment, destination operand identifier 366 is the same as source operand identifier 365, whereas in other embodiments they are different. In one embodiment, one of the source operands identified by source operand identifiers 364 and 365 is overwritten by the results of the instruction, whereas in other embodiments identifier 364 corresponds to a source register element and identifier 365 corresponds to a destination register element. For one embodiment, operand identifiers 364 and 365 may be used to identify 32-bit or 64-bit source and destination operands.

Figure 3B:
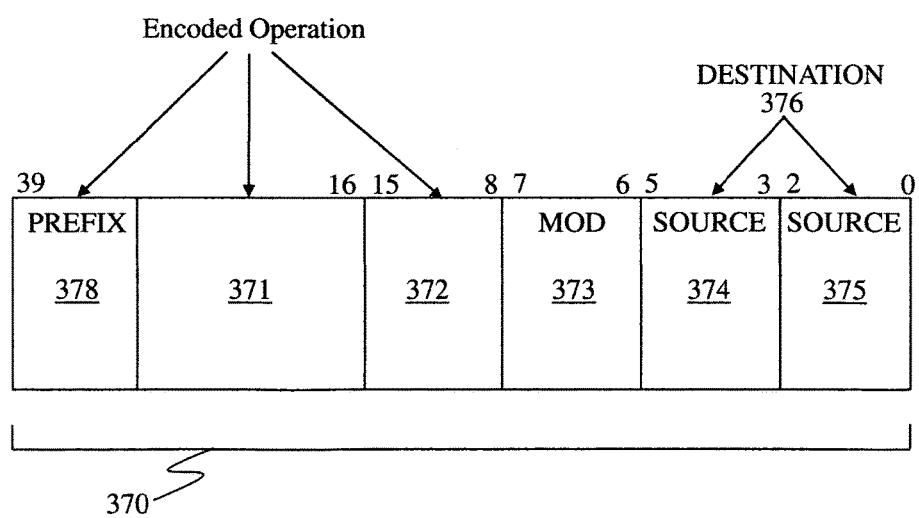
FIG. 3B illustrates an instruction encoding to provide functionality for testing transactional execution status according to another embodiment.

FIG. 3B is a depiction of another alternative operation encoding (opcode) format 370, having forty or more bits. Opcode format 370 corresponds with opcode format 360 and comprises an optional prefix byte 378. An instruction according to one embodiment may be encoded by one or more of fields 378, 371, and 372. Up to two operand locations per instruction may be identified by source operand identifiers 374 and 375 and by prefix byte 378. For one embodiment, prefix byte 378 may be used to identify 32-bit or 64-bit source and destination operands. For one embodiment, destination operand identifier 376 is the same as source operand identifier 374, whereas in other embodiments they are different. For an alternative embodiment, destination operand identifier 376 is the same as source operand identifier 375, whereas in other embodiments they are different. In one embodiment, an instruction operates on one or more of the operands identified by operand identifiers 374 and 375 and one or more operands identified by the operand identifiers 374 and 375 is overwritten by the results of the instruction, whereas in other embodiments, operands identified by identifiers 374 and 375 are written to another data element in another register. Opcode formats 360 and 370 allow register to register, memory to register, register by memory, register by register, register by immediate, register to memory addressing specified in part by MOD fields 363 and 373 and by optional scale-index-base and displacement bytes.

Figure 3C:
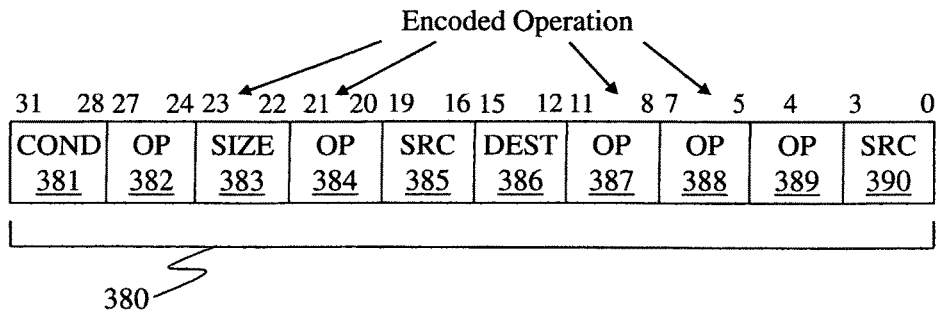
FIG. 3C illustrates an instruction encoding to provide functionality for testing transactional execution status according to another embodiment.

Turning next to FIG. 3C, in some alternative embodiments, 64-bit (or 128-bit, or 256-bit, or 512-bit or more) single instruction multiple data (SIMD) arithmetic operations may be performed through a coprocessor data processing (CDP) instruction. Operation encoding (opcode) format 380 depicts one such CDP instruction having CDP opcode fields 382 and 389. The type of CDP instruction, for alternative embodiments, operations may be encoded by one or more of fields 383, 384, 387, and 388. Up to three operand locations per instruction may be identified, including up to two source operand identifiers 385 and 390 and one destination operand identifier 386. One embodiment of the coprocessor can operate on 8, 16, 32, and 64 bit values. For one embodiment, an instruction is performed on integer data elements. In some embodiments, an instruction may be executed conditionally, using condition field 381. For some embodiments, source data sizes may be encoded by field 383. In some embodiments, Zero (Z), negative (N), carry (C), and overflow (V) detection can be done on SIMD fields. For some instructions, the type of saturation may be encoded by field 384.

Figure 3D:
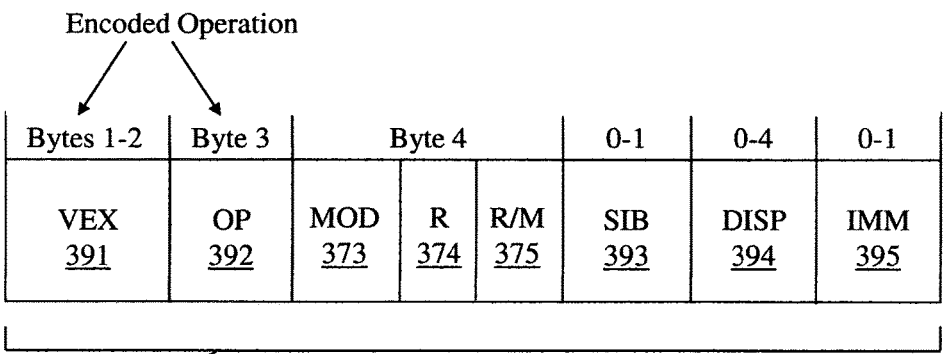
FIG. 3D illustrates an instruction encoding to provide functionality for testing transactional execution status according to another embodiment.

Turning next to FIG. 3D is a depiction of another alternative operation encoding (opcode) format 397, to provide functionality for testing transactional execution status according to another embodiment, corresponding with a type of opcode format described in the "Intel® Advanced Vector Extensions Programming Reference," which is available from Intel Corp., Santa Clara, Calif. on the world-wide-web (www) at intel.com/products/processor/manuals/.

The original x86 instruction set provided for a 1-byte opcode with various formats of address syllable and immediate operand contained in additional bytes whose presence was known from the first "opcode" byte. Additionally, there were certain byte values that were reserved as modifiers to the opcode (called prefixes, as they had to be placed before the instruction). When the original palette of 256 opcode bytes (including these special prefix values) was exhausted, a single byte was dedicated as an escape to a new set of 256 opcodes. As vector instructions (e.g., SIMD) were added, a need for more opcodes was generated, and the "two byte" opcode map also was insufficient, even when expanded through the use of prefixes. To this end, new instructions were added in additional maps which use 2 bytes plus an optional prefix as an identifier.

Additionally, in order to facilitate additional registers in 64-bit mode, an additional prefix may be used (called "REX") in between the prefixes and the opcode (and any escape bytes necessary to determine the opcode). In one embodiment, the REX may have 4 "payload" bits to indicate use of additional registers in 64-bit mode. In other embodiments it may have fewer or more than 4 bits. The general format of at least one instruction set (which corresponds generally with format 360 and/or format 370) is illustrated generically by the following:

[prefixes] [rex] escape [escape2] opcode modrm (etc.)

Opcode format 397 corresponds with opcode format 370 and comprises optional VEX prefix bytes 391 (beginning with C4 hex or C5 hex in one embodiment) to replace most other commonly used legacy instruction prefix bytes and escape codes. For example, the following illustrates an embodiment using two fields to encode an instruction, which may be used when a second escape code is not present in the original instruction. In the embodiment illustrated below, legacy escape is represented by a new escape value, legacy prefixes are fully compressed as part of the "payload" bytes, legacy prefixes are reclaimed and available for future expansion, and new features are added (e.g., increased vector length and an additional source register specifier).

[prefixes] [rex] escape opcode modrm [sib] [disp] [imm]

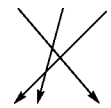

vex WvvvvLpp opcode modrm [sib] [disp] [imm]

new features

When a second escape code is present in the original instruction, or when extra bits (e.g, the XB and W fields) in the REX field need to be used. In the alternative embodiment illustrated below, the first legacy escape and legacy prefixes are compressed similar to the above, and the second escape code is compressed in a "map" field, with future map or feature space available, and again, new features are added (e.g., increased vector length and an additional source register specifier).

[prefixes] [rex] escape [escape2] opcode modrm [sib] [disp] [imm]

vex RXBmmmmm WvvvLpp opcode modrm [sib] [disp] [imm]

new features

An instruction according to one embodiment may be encoded by one or more of fields 391 and 392. Up to four operand locations per instruction may be identified by field 391 in combination with source operand identifiers 374 and 375 and in combination with an optional scale-index-base (SIB) identifier 393, an optional displacement identifier 394, and an optional immediate byte 395. For one embodiment, VEX prefix bytes 391 may be used to identify 32-bit or 64-bit source and destination operands and/or 128-bit or 256-bit SIMD register or memory operands. For one embodiment, the functionality provided by opcode format 397 may be redundant with opcode format 370, whereas in other embodiments they are different. Opcode formats 370 and 397 allow register to register, memory to register, register by memory, register by register, register by immediate, register to memory addressing specified in part by MOD field 373 and by optional (SIB) identifier 393, an optional displacement identifier 394, and an optional immediate byte 395.

Figure 3E:
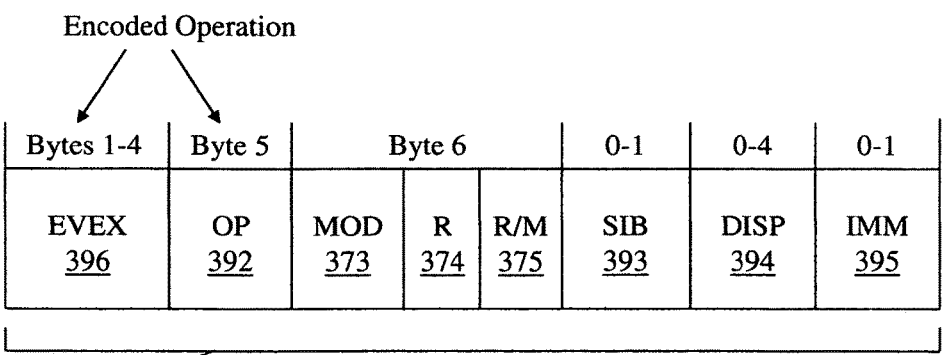
FIG. 3E illustrates an instruction encoding to provide functionality for testing transactional execution status according to another embodiment.

Turning next to FIG. 3E is a depiction of another alternative operation encoding (opcode) format 398, to provide functionality for testing transactional execution status according to another embodiment. Opcode format 398 corresponds with opcode formats 370 and 397 and comprises optional EVEX prefix bytes 396 (beginning with 62 hex in one embodiment) to replace most other commonly used legacy instruction prefix bytes and escape codes and provide additional functionality. An instruction according to one embodiment may be encoded by one or more of fields 396 and 392. Up to four operand locations per instruction and a mask may be identified by field 396 in combination with source operand identifiers 374 and 375 and in combination with an optional scale-index-base (SIB) identifier 393, an optional displacement identifier 394, and an optional immediate byte 395. For one embodiment, EVEX prefix bytes 396 may be used to identify 32-bit or 64-bit source and destination operands and/or 128-bit, 256-bit or 512-bit SIMD register or memory operands. For one embodiment, the functionality provided by opcode format 398 may be redundant with opcode formats 370 or 397, whereas in other embodiments they are different. Opcode format 398 allows register to register, memory to register, register by memory, register by register, register by immediate, register to memory addressing, with masks, specified in part by MOD field 373 and by optional (SIB) identifier 393, an optional displacement identifier 394, and an optional immediate byte 395. The general format of at least one instruction set (which corresponds generally with format 360 and/or format 370) is illustrated generically by the following:

evex1 RXBmmmmm WvvvLpp evex4 opcode modrm [sib] [disp] [imm]

is binary such as addition or multiplication requiring an additional operand. Some embodiments of EVEX format 398 may also be used to provide functionality for testing transactional execution status and an implicit completion mask and with additional operation is ternary. Additionally, where VEX format 397 may be used to provide functionality for testing transactional execution status on 128-bit or 256-bit vector registers, EVEX format 398 may be used to provide functionality for testing transactional execution status on 128-bit, 256-bit, 512-bit or larger (or smaller) vector registers.

It will be appreciated that some embodiments of instructions and logic to test transactional execution status may specify explicit source operands and/or destination operands, while some embodiments may have implicit source operands and/or destination operands. Example instructions to provide functionality for testing transactional execution status (referred to below as XTEST) are illustrated by the following examples:

| Instruction | destination | source1 | description |
|---|---|---|---|
| XTEST | | | If the instruction executes inside a transactionally executing region, then clear the zero flag (ZF) to zero. Otherwise set the ZF to one. |
| XTEST.NL | Reg32 | | If the instruction executes inside a transactionally executing region, then store the nesting level in Reg32 and clear the zero flag (ZF) to zero. Otherwise store zero in Reg32 and set the ZF to one. |
| XTEST.BA | Reg32 | | If the instruction executes inside a transactionally executing region, then store the number/size of available internal buffers left in Reg32 and clear the zero flag (ZF) to zero. Otherwise store zero in Reg32 and set the ZF to one. |
| XTEST.BV | | Mem | If the instruction executes inside a transactionally executing region, then clear the zero flag (ZF) to zero, and if a transaction to Mem would overflow the internal buffers, then set the overflow flag (OF) to one. Otherwise set the ZF to one, and clear the OF to zero. |
| XTEST.MV | | Mem | If the instruction executes inside a transactionally executing region, then clear the zero flag (ZF) to zero. Otherwise set the ZF to one. If an access to Mem could conflict with another transactional execution, then set the overflow flag (OF) to one. Otherwise clear the OF to zero. |
| XTEST.BM | Reg32 | Mem | If the instruction executes inside a transactionally executing region, then store the number/size of available internal buffers left in Reg32 and clear the zero flag (ZF) to zero. Otherwise store zero in Reg32 and set the ZF to one. If a read access to Mem could conflict with another transactional execution, then set the carry flag (CF) to one. If a write access to Mem could conflict with another transactional execution, then set the overflow flag (OF) to one. |

For one embodiment an instruction encoded according to the EVEX format 398 may have additional "payload" bits that may be used to provide functionality for testing transactional execution status with additional new features such as, for example, a user configurable mask register, or an additional operand, or selections from among 128-bit, 256-bit or 512-bit vector registers, or more registers from which to select, etc.

Figure 4A:
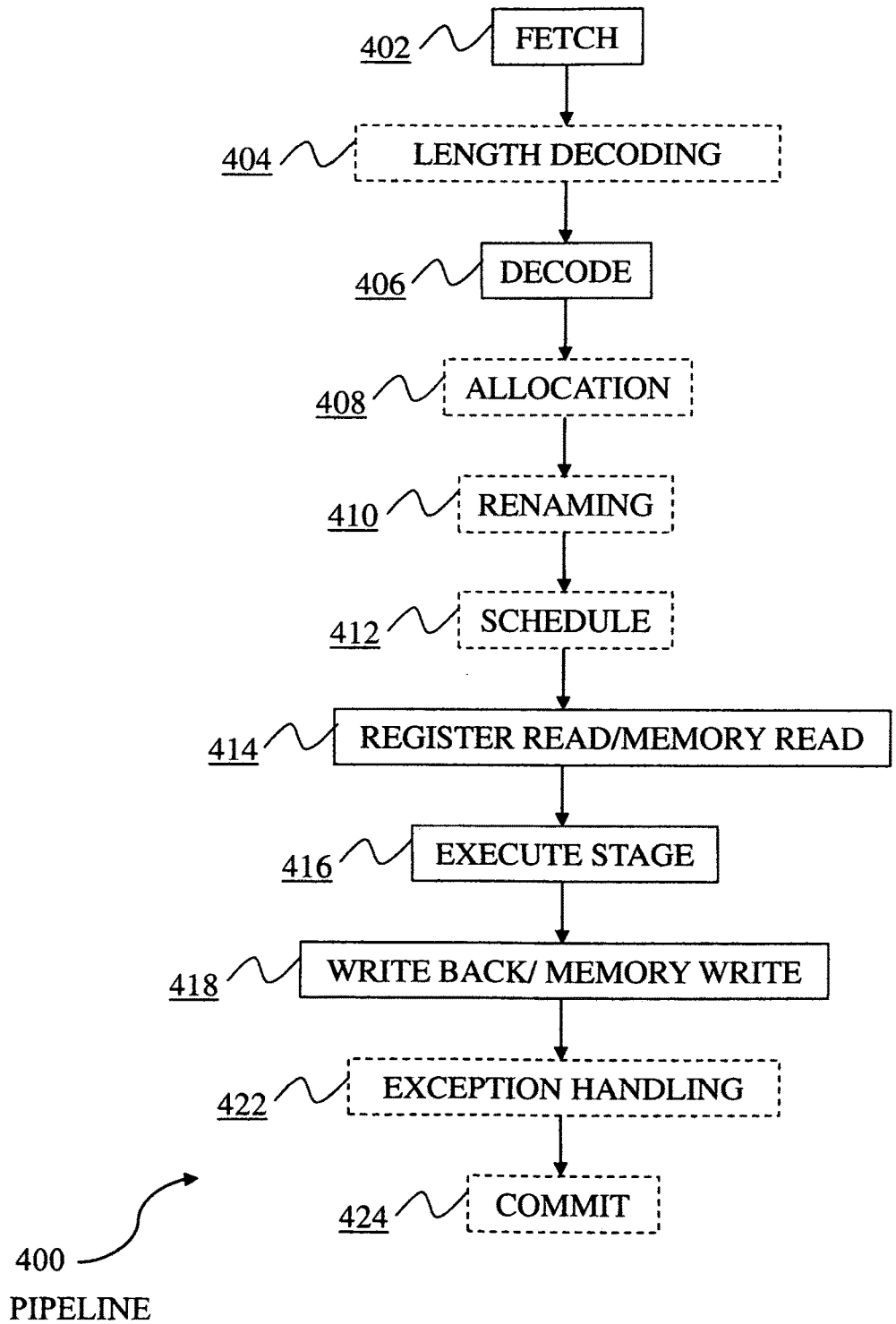
FIG. 4A illustrates a block diagram for one embodiment of stages in a processor micro-architecture to execute instructions that provide functionality for testing transactional execution status.
Figure 4B:
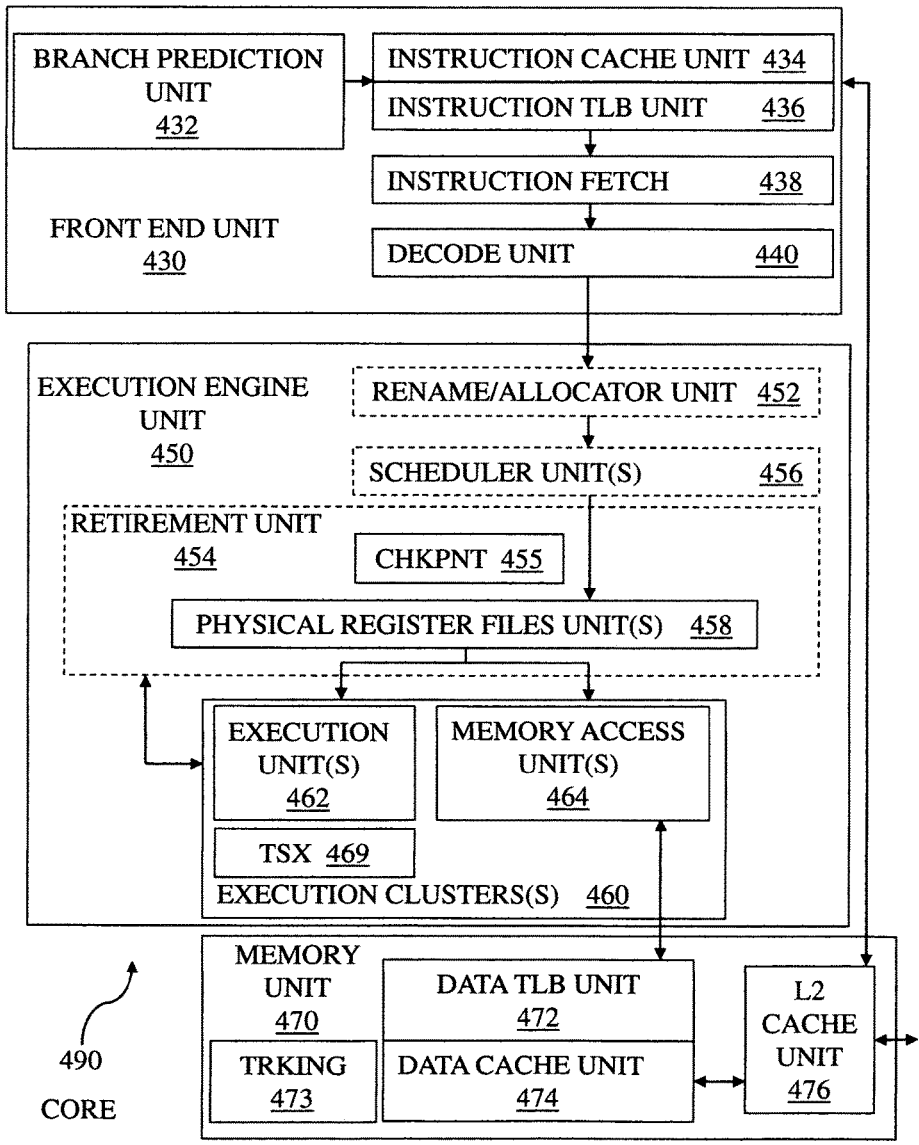
FIG. 4B illustrates elements of one embodiment of a processor micro-architecture to execute instructions that provide functionality for testing transactional execution status.

For example, where VEX format 397 may be used to provide functionality for testing transactional execution status with an explicit mask and with or without an additional operation that is unary such as a type conversion, the EVEX format 398 may be used to provide functionality for testing transactional execution status with an explicit user configurable mask and with or without an additional operation that FIG. 4A is a block diagram illustrating an in-order pipeline and a register renaming stage, out-of-order issue/execution pipeline according to at least one embodiment of the invention. FIG. 4B is a block diagram illustrating an in-order architecture core and a register renaming logic, out-of-order issue/execution logic to be included in a processor according to at least one embodiment of the invention. The solid lined boxes in FIG. 4A illustrate the in-order pipeline, while the dashed lined boxes illustrates the register renaming, out-of-order issue/execution pipeline. Similarly, the solid lined boxes in FIG. 4B illustrate the in-order architecture logic, while the dashed lined boxes illustrates the register renaming logic and out-of-order issue/execution logic.

In FIG. 4A, a processor pipeline 400 includes a fetch stage 402, a length decode stage 404, a decode stage 406, an allocation stage 408, a renaming stage 410, a scheduling (also known as a dispatch or issue) stage 412, a register read/memory read stage 414, an execute stage 416, a write back/memory write stage 418, an exception handling stage 422, and a commit stage 424.

In FIG. 4B, arrows denote a coupling between two or more units and the direction of the arrow indicates a direction of data flow between those units. FIG. 4B shows processor core 490 including a front end unit 430 coupled to an execution engine unit 450, and both are coupled to a memory unit 470.

The core 490 may be a reduced instruction set computing (RISC) core, a complex instruction set computing (CISC) core, a very long instruction word (VLIW) core, or a hybrid or alternative core type. As yet another option, the core 490 may be a special-purpose core, such as, for example, a network or communication core, compression engine, graphics core, or the like.

The front end unit 430 includes a branch prediction unit 432 coupled to an instruction cache unit 434, which is coupled to an instruction translation lookaside buffer (TLB) 436, which is coupled to an instruction fetch unit 438, which is coupled to a decode unit 440. The decode unit or decoder may decode instructions, and generate as an output one or more micro-operations, micro-code entry points, microinstructions, other instructions, or other control signals, which are decoded from, or which otherwise reflect, or are derived from, the original instructions. The decoder may be implemented using various different mechanisms. Examples of suitable mechanisms include, but are not limited to, look-up tables, hardware implementations, programmable logic arrays (PLAs), microcode read only memories (ROMs), etc. The instruction cache unit 434 is further coupled to a level 2 (L2) cache unit 476 in the memory unit 470. The decode unit 440 is coupled to a rename/allocator unit 452 in the execution engine unit 450.

The execution engine unit 450 includes the rename/allocator unit 452 coupled to a retirement unit 454 and a set of one or more scheduler unit(s) 456. The scheduler unit(s) 456 represents any number of different schedulers, including reservations stations, central instruction window, etc. The scheduler unit(s) 456 is coupled to the physical register file(s) unit(s) 458. Each of the physical register file(s) units 458 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The physical register file(s) unit(s) 458 is overlapped by the retirement unit 454 to illustrate various ways in which register renaming and out-of-order execution may be implemented (e.g., using a reorder buffer(s) and a retirement register file(s), using a future file(s), a history buffer(s), and a retirement register file(s); using a register maps and a pool of registers; etc.). Generally, the architectural registers are visible from the outside of the processor or from a programmer's perspective. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The retirement unit 454 and the physical register file(s) unit(s) 458 are coupled to the execution cluster(s) 460. The execution cluster(s) 460 includes a set of one or more execution units 462 and a set of one or more memory access units 464. The execution units 462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The scheduler unit(s) 456, physical register file(s) unit(s) 458, and execution cluster(s) 460 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own scheduler unit, physical register file(s) unit, and/or execution cluster, and in the case of a separate memory access pipeline, certain embodiments are implemented in which only the execution cluster of this pipeline has the memory access unit(s) 464). It should also be understood that where separate pipelines are used, one or more of these pipelines may be out-of-order issue/execution and the rest in-order.

The set of memory access units 464 is coupled to the memory unit 470, which includes a data TLB unit 472 coupled to a data cache unit 474 coupled to a level 2 (L2) cache unit 476. In one exemplary embodiment, the memory access units 464 may include a load unit, a store address unit, and a store data unit, each of which is coupled to the data TLB unit 472 in the memory unit 470. The L2 cache unit 476 is coupled to one or more other levels of cache and eventually to a main memory.

By way of example, the exemplary register renaming, out-of-order issue/execution core architecture may implement the pipeline 400 as follows: 1) the instruction fetch 438 performs the fetch and length decoding stages 402 and 404; 2) the decode unit 440 performs the decode stage 406; 3) the rename/allocator unit 452 performs the allocation stage 408 and renaming stage 410; 4) the scheduler unit(s) 456 performs the schedule stage 412; 5) the physical register file(s) unit(s) 458 and the memory unit 470 perform the register read/memory read stage 414; the execution cluster 460 perform the execute stage 416; 6) the memory unit 470 and the physical register file(s) unit(s) 458 perform the write back/memory write stage 418; 7) various units may be involved in the exception handling stage 422; and 8) the retirement unit 454 and the physical register file(s) unit(s) 458 perform the commit stage 424.

The core 490 may support one or more instructions sets (e.g., the x86 instruction set (with some extensions that have been added with newer versions); the MIPS instruction set of MIPS Technologies of Sunnyvale, Calif.; the ARM instruction set (with optional additional extensions such as NEON) of ARM Holdings of Sunnyvale, Calif.).

It should be understood that the core may support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

For one embodiment, execution engine unit 450 includes TSX logic 469 to handle a TSX instruction set. By including the TSX instruction set in the instruction set of a general-purpose processor core 490, along with associated TSX logic 469 to execute the instructions, the operations used by many multithreaded applications may be performed using restricted transactional memory or hardware lock elision in a general-purpose processor core 490. Thus, many multi-threaded applications can be accelerated and executed more efficiently by using the restricted transactional memory or hardware lock elision for performing synchronization on shared data. This can eliminate the need to perform unnecessary synchronization on critical sections of shared memory that have relatively few conflicts. Tracking logic 473 is provided in memory unit 470 to track memory accesses from thread processing elements associated with transactional regions of shared memory in cache of memory unit 470. In one embodiment, checkpoint logic 455 is provided to checkpoint the set of architecture state registers in register files unit 458 for threads executed by thread processing elements of core 490.

While register renaming is described in the context of out-of-order execution, it should be understood that register renaming may be used in an in-order architecture. While the illustrated embodiment of the processor also includes a separate instruction and data cache units 434/474 and a shared L2 cache unit 476, alternative embodiments may have a single internal cache for both instructions and data, such as, for example, a Level 1 (L1) internal cache, or multiple levels of internal cache. In some embodiments, the system may include a combination of an internal cache and an external cache that is external to the core and/or the processor. Alternatively, all of the cache may be external to the core and/or the processor.

Figure 5:
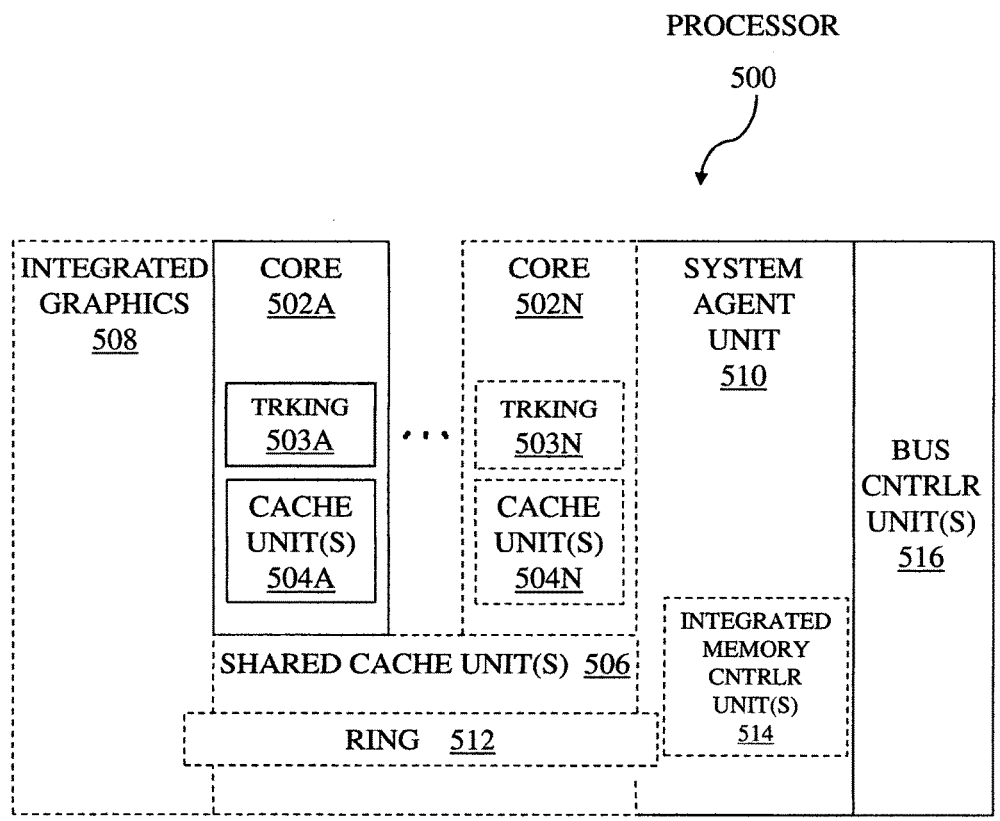
FIG. 5 is a block diagram of one embodiment of a processor to execute instructions that provide functionality for testing transactional execution status.

FIG. 5 is a block diagram of a single core processor and a multicore processor 500 with integrated memory controller and graphics according to embodiments of the invention. The solid lined boxes in FIG. 5 illustrate a processor 500 with a single core 502A, a system agent 510, a set of one or more bus controller units 516, while the optional addition of the dashed lined boxes illustrates an alternative processor 500 with multiple cores 502A-N, a set of one or more integrated memory controller unit(s) 514 in the system agent unit 510, and an integrated graphics logic 508.

The memory hierarchy includes one or more levels of cache 504A-N within the cores, a set or one or more shared cache units 506, and external memory (not shown) coupled to the set of integrated memory controller units 514. The set of shared cache units 506 may include one or more mid-level caches, such as level 2 (L2), level 3 (L3), level 4 (L4), or other levels of cache, a last level cache (LLC), and/or combinations thereof. Tracking logic 503A-N is provided to track memory accesses from thread processing elements associated with transactional regions of shared memory in cache memories 504A-N and/or shared cache units 506. While in one embodiment a ring based interconnect unit 512 interconnects the integrated graphics logic 508, the set of shared cache units 506, and the system agent unit 510, alternative embodiments may use any number of well-known techniques for interconnecting such units.

In some embodiments, one or more of the cores 502A-N are capable of multithreading. The system agent 510 includes those components coordinating and operating cores 502A-N. The system agent unit 510 may include for example a power control unit (PCU) and a display unit. The PCU may be or include logic and components needed for regulating the power state of the cores 502A-N and the integrated graphics logic 508. The display unit is for driving one or more externally connected displays.

The cores 502A-N may be homogenous or heterogeneous in terms of architecture and/or instruction set. For example, some of the cores 502A-N may be in order while others are out-of-order. As another example, two or more of the cores 502A-N may be capable of execution the same instruction set, while others may be capable of executing only a subset of that instruction set or a different instruction set.

The processor may be a general-purpose processor, such as a Core™ i3, i5, i7, 2 Duo and Quad, Xeon™, Itanium™, XScale™ or StrongARM™ processor, which are available from Intel Corporation, of Santa Clara, Calif. Alternatively, the processor may be from another company, such as ARM Holdings, Ltd, MIPS, etc. The processor may be a special-purpose processor, such as, for example, a network or communication processor, compression engine, graphics processor, co-processor, embedded processor, or the like. The processor may be implemented on one or more chips. The processor 500 may be a part of and/or may be implemented on one or more substrates using any of a number of process technologies, such as, for example, BiCMOS, CMOS, or NMOS.

Figure 6:
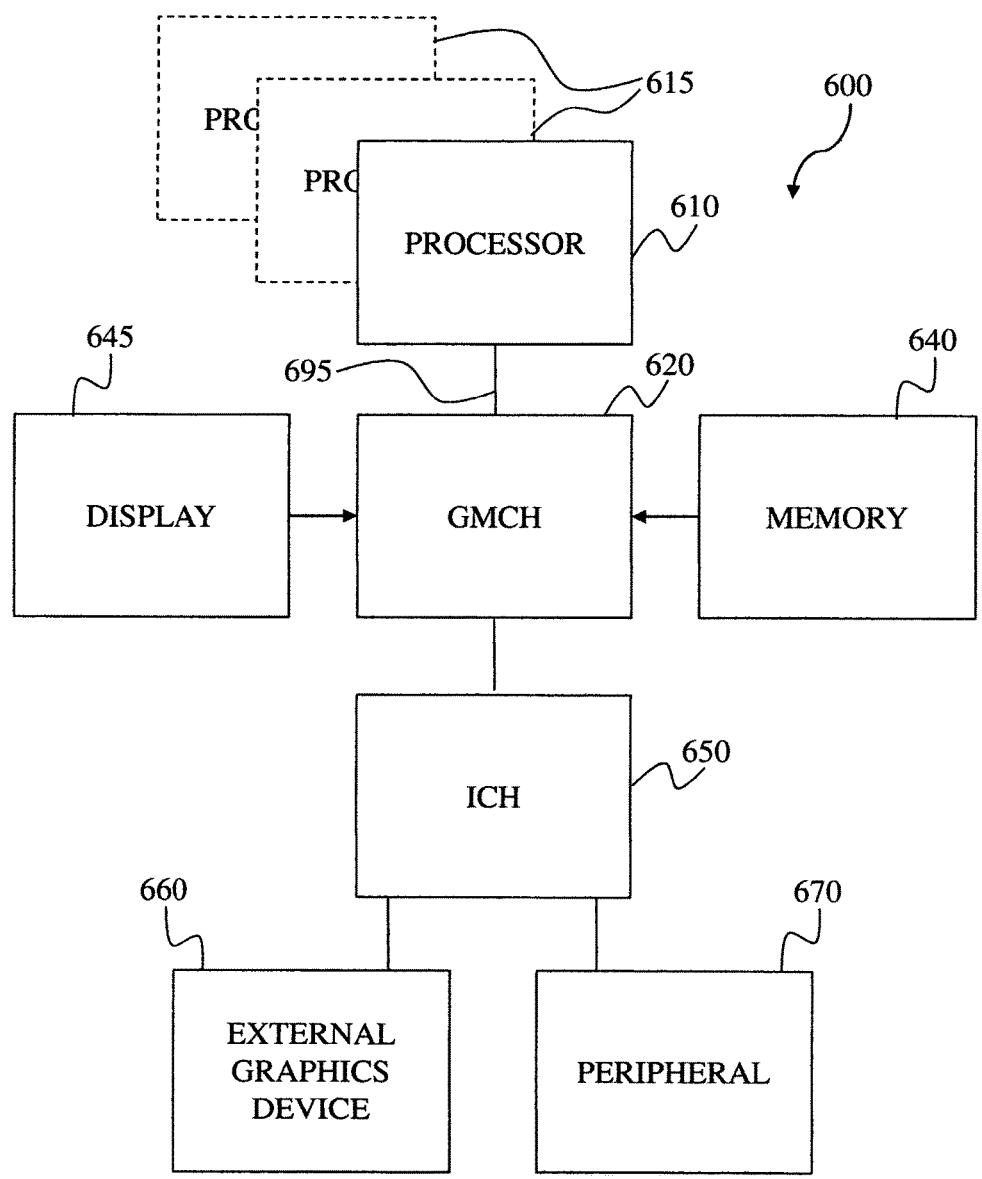
FIG. 6 is a block diagram of one embodiment of a computer system to execute instructions that provide functionality for testing transactional execution status.
Figure 7:
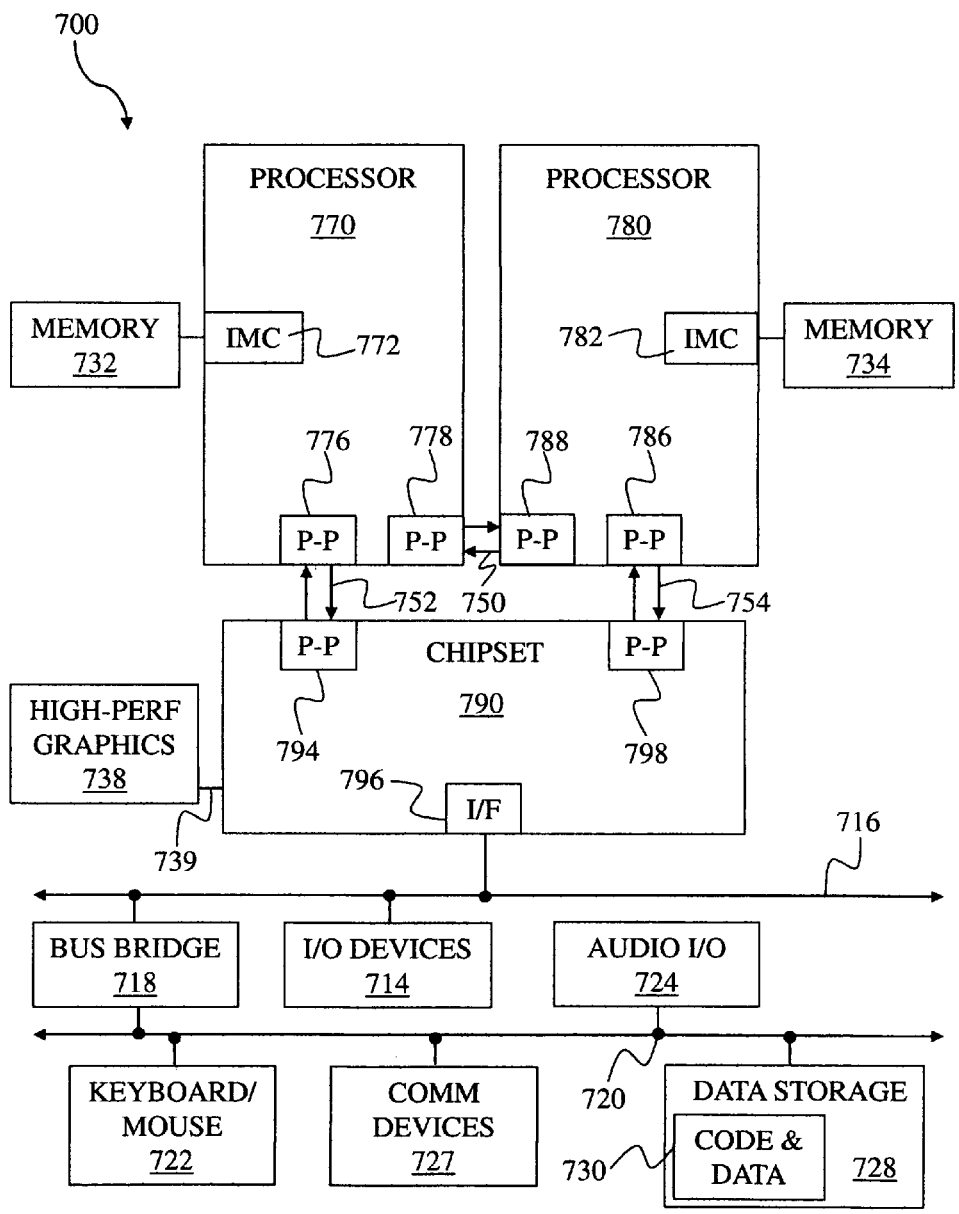
FIG. 7 is a block diagram of another embodiment of a computer system to execute instructions that provide functionality for testing transactional execution status.
Figure 8:
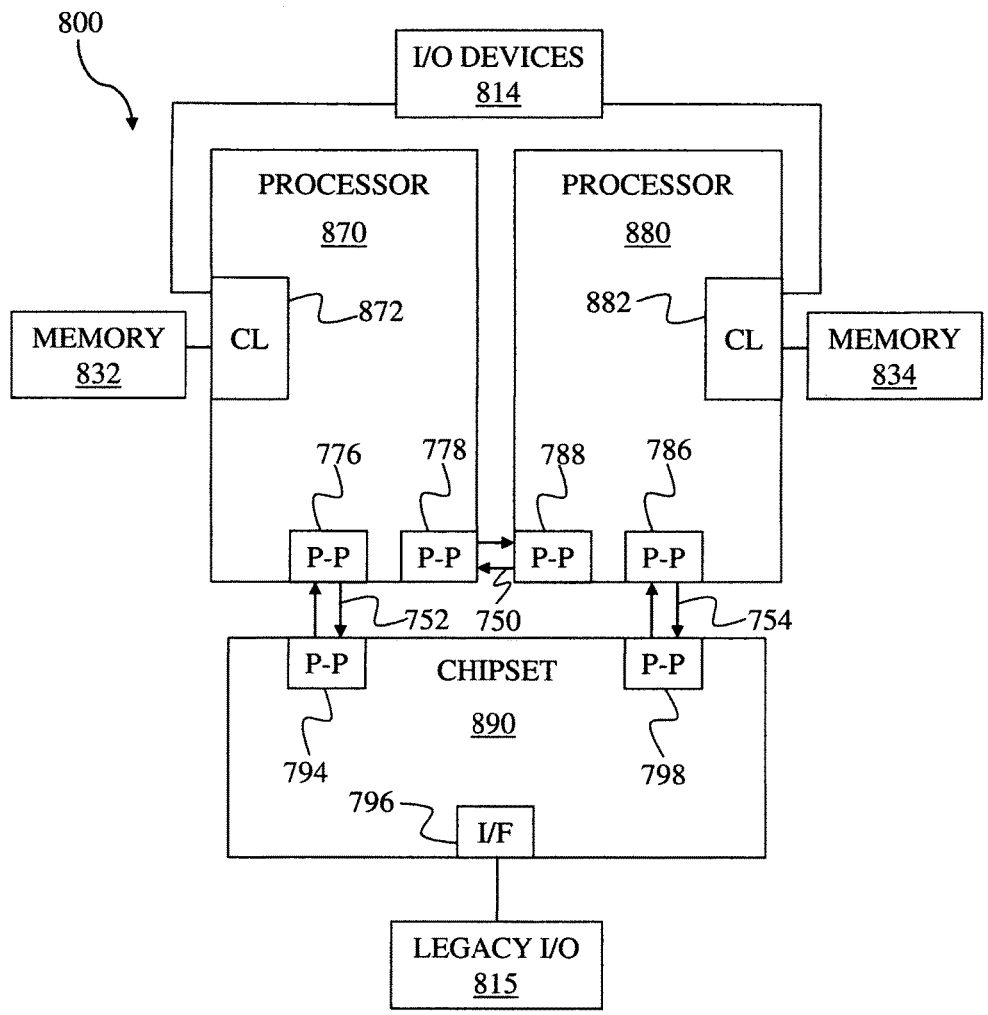
FIG. 8 is a block diagram of another embodiment of a computer system to execute instructions that provide functionality for testing transactional execution status.
Figure 9:
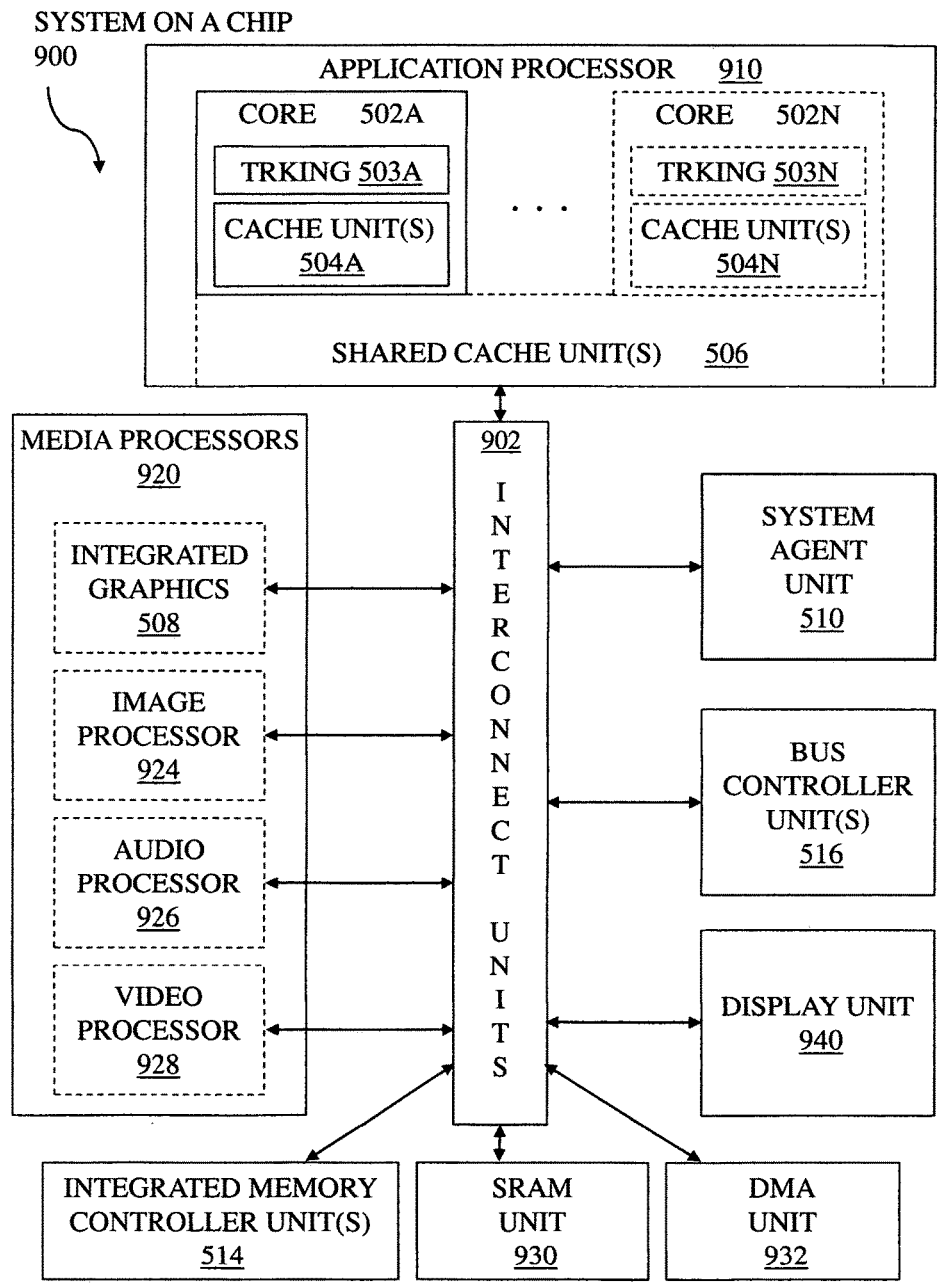
FIG. 9 is a block diagram of one embodiment of a system-on-a-chip to execute instructions that provide functionality for testing transactional execution status.

FIGS. 6-8 are exemplary systems suitable for including the processor 500, while FIG. 9 is an exemplary system on a chip (SoC) that may include one or more of the cores 502. Other system designs and configurations known in the arts for laptops, desktops, handheld PCs, personal digital assistants, engineering workstations, servers, network devices, network hubs, switches, embedded processors, digital signal processors (DSPs), graphics devices, video game devices, set-top boxes, micro controllers, cell phones, portable media players, hand held devices, and various other electronic devices, are also suitable. In general, a huge variety of systems or electronic devices capable of incorporating a processor and/or other execution logic as disclosed herein are generally suitable.

Referring now to FIG. 6, shown is a block diagram of a system 600 in accordance with one embodiment of the present invention. The system 600 may include one or more processors 610, 615, which are coupled to graphics memory controller hub (GMCH) 620. The optional nature of additional processors 615 is denoted in FIG. 6 with broken lines.

Each processor 610,615 may be some version of the processor 500. However, it should be noted that it is unlikely that integrated graphics logic and integrated memory control units would exist in the processors 610,615. FIG. 6 illustrates that the GMCH 620 may be coupled to a memory 640 that may be, for example, a dynamic random access memory (DRAM). The DRAM may, for at least one embodiment, be associated with a non-volatile cache and tracking logic may also be provided to track memory accesses from thread processing elements associated with transactional regions of shared memory in the non-volatile cache.

The GMCH 620 may be a chipset, or a portion of a chipset. The GMCH 620 may communicate with the processor(s) 610, 615 and control interaction between the processor(s) 610, 615 and memory 640. The GMCH 620 may also act as an accelerated bus interface between the processor(s) 610, 615 and other elements of the system 600. For at least one embodiment, the GMCH 620 communicates with the processor(s) 610, 615 via a multi-drop bus, such as a frontside bus (FSB) 695.

Furthermore, GMCH 620 is coupled to a display 645 (such as a flat panel display). GMCH 620 may include an integrated graphics accelerator. GMCH 620 is further coupled to an input/output (I/O) controller hub (ICH) 650, which may be used to couple various peripheral devices to system 600. Shown for example in the embodiment of FIG.

6 is an external graphics device 660, which may be a discrete graphics device coupled to ICH 650, along with another peripheral device 670.

Alternatively, additional or different processors may also be present in the system 600. For example, additional processor(s) 615 may include additional processors(s) that are the same as processor 610, additional processor(s) that are heterogeneous or asymmetric to processor 610, accelerators (such as, e.g., graphics accelerators or digital signal processing (DSP) units), field programmable gate arrays, or any other processor. There can be a variety of differences between the physical resources 610, 615 in terms of a spectrum of metrics of merit including architectural, microarchitectural, thermal, power consumption characteristics, and the like. These differences may effectively manifest themselves as asymmetry and heterogeneity amongst the processors 610, 615. For at least one embodiment, the various processors 610, 615 may reside in the same die package.

Referring now to FIG. 7, shown is a block diagram of a second system 700 in accordance with an embodiment of the present invention. As shown in FIG. 7, multiprocessor system 700 is a point-to-point interconnect system, and includes a first processor 770 and a second processor 780 coupled via a point-to-point interconnect 750. Each of processors 770 and 780 may be some version of the processor 500 as one or more of the processors 610,615.

While shown with only two processors 770, 780, it is to be understood that the scope of the present invention is not so limited. In other embodiments, one or more additional processors may be present in a given processor.

Processors 770 and 780 are shown including integrated memory controller units 772 and 782, respectively. Processor 770 also includes as part of its bus controller units point-to-point (P-P) interfaces 776 and 778; similarly, second processor 780 includes P-P interfaces 786 and 788. Processors 770, 780 may exchange information via a point-to-point (P-P) interface 750 using P-P interface circuits 778, 788. As shown in FIG. 7, IMCs 772 and 782 couple the processors to respective memories, namely a memory 732 and a memory 734, which may be portions of main memory locally attached to the respective processors.

Processors 770, 780 may each exchange information with a chipset 790 via individual P-P interfaces 752, 754 using point to point interface circuits 776, 794, 786, 798. Chipset 790 may also exchange information with a high-performance graphics circuit 738 via a high-performance graphics interface 739.

A shared cache (not shown) may be included in either processor or outside of both processors, yet connected with the processors via P-P interconnect, such that either or both processors' local cache information may be stored in the shared cache if a processor is placed into a low power mode. Tracking logic may be provided to track memory accesses from thread processing elements associated with transactional regions of shared memory in shared cache.

Chipset 790 may be coupled to a first bus 716 via an interface 796. In one embodiment, first bus 716 may be a Peripheral Component Interconnect (PCI) bus, or a bus such as a PCI Express bus or another third generation I/O interconnect bus, although the scope of the present invention is not so limited.

As shown in FIG. 7, various I/O devices 714 may be coupled to first bus 716, along with a bus bridge 718 which couples first bus 716 to a second bus 720. In one embodiment, second bus 720 may be a low pin count (LPC) bus. Various devices may be coupled to second bus 720 including, for example, a keyboard and/or mouse 722, communication devices 727 and a storage unit 728 such as a disk drive or other mass storage device which may include instructions/code and data 730, in one embodiment. Further, an audio I/O 724 may be coupled to second bus 720. Note that other architectures are possible. For example, instead of the point-to-point architecture of FIG. 7, a system may implement a multi-drop bus or other such architecture.

Referring now to FIG. 8, shown is a block diagram of a third system 800 in accordance with an embodiment of the present invention. Like elements in FIG. 7 and FIG. 8 bear like reference numerals, and certain aspects of FIG. 7 have been omitted from FIG. 8 in order to avoid obscuring other aspects of FIG. 8.

FIG. 8 illustrates that the processors 870, 880 may include integrated memory and I/O control logic ("CL") 872 and 882, respectively. For at least one embodiment, the CL 872, 882 may include integrated memory controller units such as that described above in connection with FIGS. 5 and 7. In addition. CL 872, 882 may also include I/O control logic. FIG. 8 illustrates that not only are the memories 832, 834 coupled to the CL 872, 882, but also that I/O devices 814 are also coupled to the control logic 872, 882. Legacy I/O devices 815 are coupled to the chipset 890.

Referring now to FIG. 9, shown is a block diagram of a SoC 900 in accordance with an embodiment of the present invention. Similar elements in FIG. 5 bear like reference numerals. Also, dashed lined boxes are optional features on more advanced SoCs. In FIG. 9, an interconnect unit(s) 902 is coupled to: an application processor 910 which includes a set of one or more cores 502A-N; one or more levels of cache 504A-N within the cores; and shared cache unit(s) 506; tracking logic 503A-N to track memory accesses from thread processing elements associated with transactional regions of shared memory in cache memories 504A-N and/or shared cache units 506; a system agent unit 510; a bus controller unit(s) 516; an integrated memory controller unit(s) 514; a set of one or more media processors 920 which may include integrated graphics logic 508, an image processor 924 for providing still and/or video camera functionality, an audio processor 926 for providing hardware audio acceleration, and a video processor 928 for providing video encode/decode acceleration; an static random access memory (SRAM) unit 930; a direct memory access (DMA) unit 932; and a display unit 940 for coupling to one or more external displays.

Figure 10:
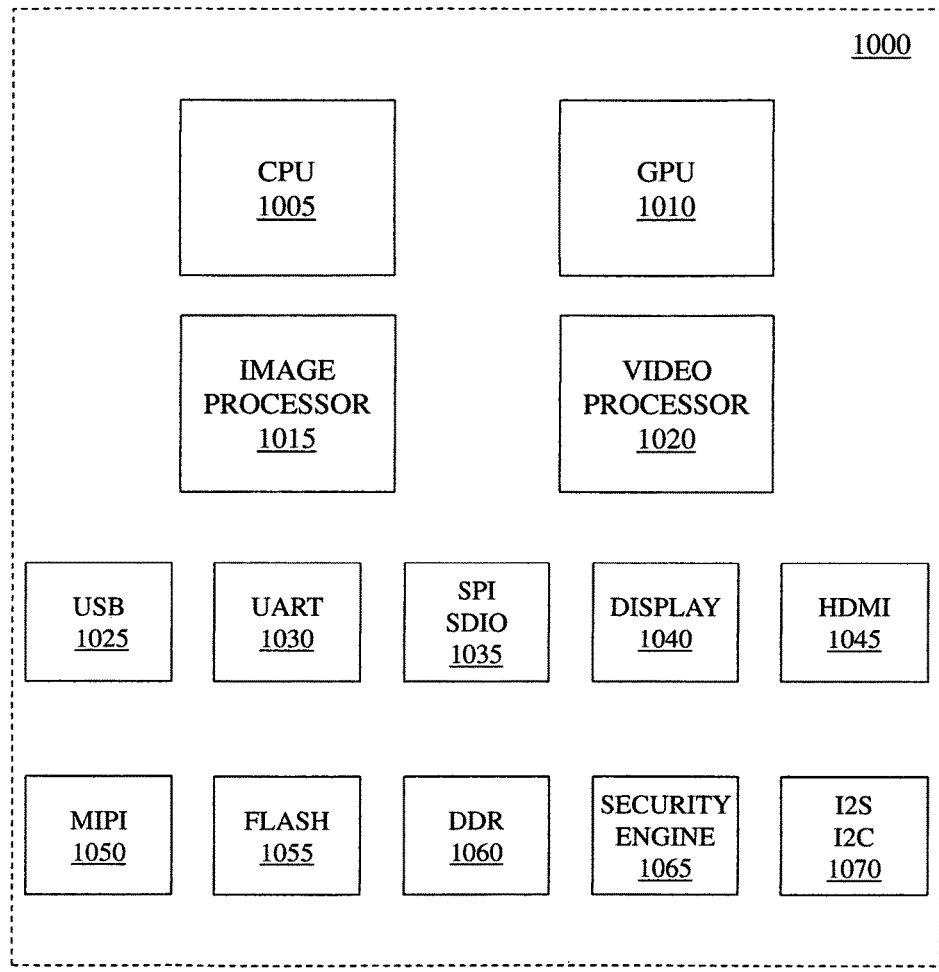
FIG. 10 is a block diagram of an embodiment of a processor to execute instructions that provide functionality for testing transactional execution status.

FIG. 10 illustrates a processor containing a central processing unit (CPU) and a graphics processing unit (GPU), which may perform at least one instruction according to one embodiment. In one embodiment, an instruction to perform operations according to at least one embodiment could be performed by the CPU. In another embodiment, the instruction could be performed by the GPU. In still another embodiment, the instruction may be performed through a combination of operations performed by the GPU and the CPU. For example, in one embodiment, an instruction in accordance with one embodiment may be received and decoded for execution on the GPU. However, one or more operations within the decoded instruction may be performed by a CPU and the result returned to the GPU for final retirement of the instruction. Conversely, in some embodiments, the CPU may act as the primary processor and the GPU as the co-processor.

In some embodiments, instructions that benefit from highly parallel, throughput processors may be performed by the GPU, while instructions that benefit from the performance of processors that benefit from deeply pipelined architectures may be performed by the CPU. For example, graphics, scientific applications, financial applications and other parallel workloads may benefit from the performance of the GPU and be executed accordingly, whereas more sequential applications, such as operating system kernel or application code may be better suited for the CPU.

In FIG. 10, processor 1000 includes a CPU 1005, GPU 1010, image processor 1015, video processor 1020, USB controller 1025, UART controller 1030, SPI/SDIO controller 1035, display device 1040, High-Definition Multimedia Interface (HDMI) controller 1045, MIPI controller 1050, flash memory controller 1055, dual data rate (DDR) controller 1060, security engine 1065, and $I^2S/I^2C$ (Integrated Interchip Sound/Inter-Integrated Circuit) interface 1070. Other logic and circuits may be included in the processor of FIG. 10, including more CPUs or GPUs and other peripheral interface controllers.

One or more aspects of at least one embodiment may be implemented by representative data stored on a machine-readable medium which represents various logic within the processor, which when read by a machine causes the machine to fabricate logic to perform the techniques described herein. Such representations, known as "IP cores" may be stored on a tangible, machine readable medium ("tape") and supplied to various customers or manufacturing facilities to load into the fabrication machines that actually make the logic or processor. For example, IP cores, such as the Cortex™ family of processors developed by ARM Holdings, Ltd. and Loongson IP cores developed the Institute of Computing Technology (ICT) of the Chinese Academy of Sciences may be licensed or sold to various customers or licensees, such as Texas Instruments, Qualcomm, Apple, or Samsung and implemented in processors produced by these customers or licensees.

Figure 11:
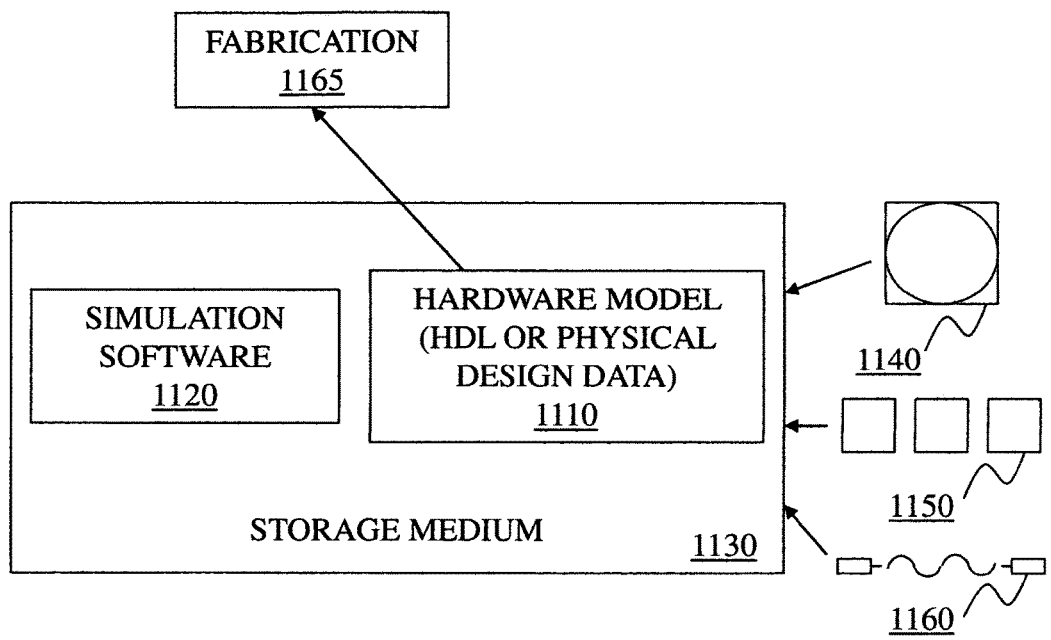
FIG. 11 is a block diagram of one embodiment of an IP core development system that provides functionality for testing transactional execution status.

FIG. 11 shows a block diagram illustrating the development of IP cores according to one embodiment. Storage 1130 includes simulation software 1120 and/or hardware or software model 1110. In one embodiment, the data representing the IP core design can be provided to the storage 1130 via memory 1140 (e.g., hard disk), wired connection (e.g., internet) 1150 or wireless connection 1160. The IP core information generated by the simulation tool and model can then be transmitted to a fabrication facility where it can be fabricated by a third party to perform at least one instruction in accordance with at least one embodiment.

In some embodiments, one or more instructions may correspond to a first type or architecture (e.g., x86) and be translated or emulated on a processor of a different type or architecture (e.g., ARM). An instruction, according to one embodiment, may therefore be performed on any processor or processor type, including ARM, x86, MIPS, a GPU, or other processor type or architecture.

Figure 12:
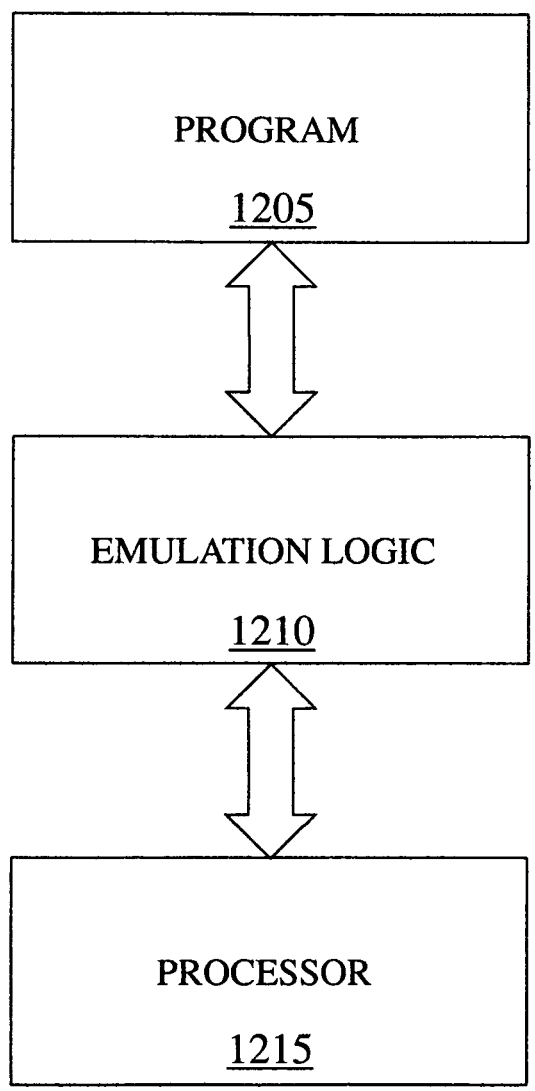
FIG. 12 illustrates one embodiment of an architecture emulation system that provides functionality for testing transactional execution status.

FIG. 12 illustrates how an instruction of a first type is emulated by a processor of a different type, according to one embodiment. In FIG. 12, program 1205 contains some instructions that may perform the same or substantially the same function as an instruction according to one embodiment. However the instructions of program 1205 may be of a type and/or format that is different or incompatible with processor 1215, meaning the instructions of the type in program 1205 may not be able to be executed natively by the processor 1215. However, with the help of emulation logic, 1210, the instructions of program 1205 are translated into instructions that are natively capable of being executed by the processor 1215. In one embodiment, the emulation logic is embodied in hardware. In another embodiment, the emulation logic is embodied in a tangible, machine-readable medium containing software to translate instructions of the type in the program 1205 into the type natively executable by the processor 1215. In other embodiments, emulation logic is a combination of fixed-function or programmable hardware and a program stored on a tangible, machine-readable medium. In one embodiment, the processor contains the emulation logic, whereas in other embodiments, the emulation logic exists outside of the processor and is provided by a third party. In one embodiment, the processor is capable of loading the emulation logic embodied in a tangible, machine-readable medium containing software by executing microcode or firmware contained in or associated with the processor.

Figure 13:
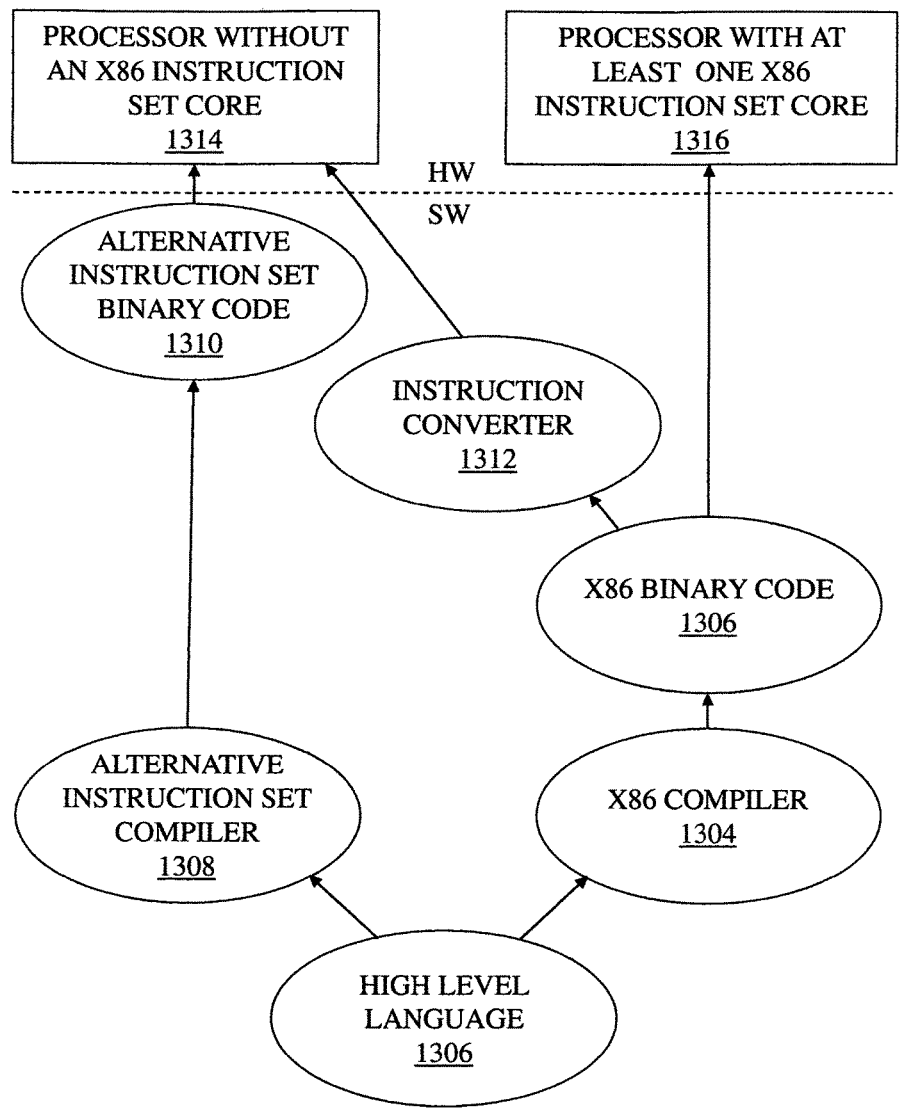
FIG. 13 illustrates one embodiment of a system to translate instructions that provide functionality for testing transactional execution status.

FIG. 13 is a block diagram contrasting the use of a software instruction converter to convert binary instructions in a source instruction set to binary instructions in a target instruction set according to embodiments of the invention. In the illustrated embodiment, the instruction converter is a software instruction converter, although alternatively the instruction converter may be implemented in software, firmware, hardware, or various combinations thereof. FIG. 13 shows a program in a high level language 1302 may be compiled using an x86 compiler 1304 to generate x86 binary code 1306 that may be natively executed by a processor with at least one x86 instruction set core 1316. The processor with at least one x86 instruction set core 1316 represents any processor that can perform substantially the same functions as a Intel processor with at least one x86 instruction set core by compatibly executing or otherwise processing (1) a substantial portion of the instruction set of the Intel x86 instruction set core or (2) object code versions of applications or other software targeted to run on an Intel processor with at least one x86 instruction set core, in order to achieve substantially the same result as an Intel processor with at least one x86 instruction set core. The x86 compiler 1304 represents a compiler that is operable to generate x86 binary code 1306 (e.g., object code) that can, with or without additional linkage processing, be executed on the processor with at least one x86 instruction set core 1316. Similarly, FIG. 13 shows the program in the high level language 1302 may be compiled using an alternative instruction set compiler 1308 to generate alternative instruction set binary code 1310 that may be natively executed by a processor without at least one x86 instruction set core 1314 (e.g., a processor with cores that execute the MIPS instruction set of MIPS Technologies of Sunnyvale, Calif. and/or that execute the ARM instruction set of ARM Holdings of Sunnyvale, Calif.). The instruction converter 1312 is used to convert the x86 binary code 1306 into code that may be natively executed by the processor without an x86 instruction set core 1314. This converted code is not likely to be the same as the alternative instruction set binary code 1310 because an instruction converter capable of this is difficult to make; however, the converted code will accomplish the general operation and be made up of instructions from the alternative instruction set. Thus, the instruction converter 1312 represents software, firmware, hardware, or a combination thereof that, through emulation, simulation or any other process, allows a processor or other electronic device that does not have an x86 instruction set processor or core to execute the x86 binary code 1306.

Figure 14:
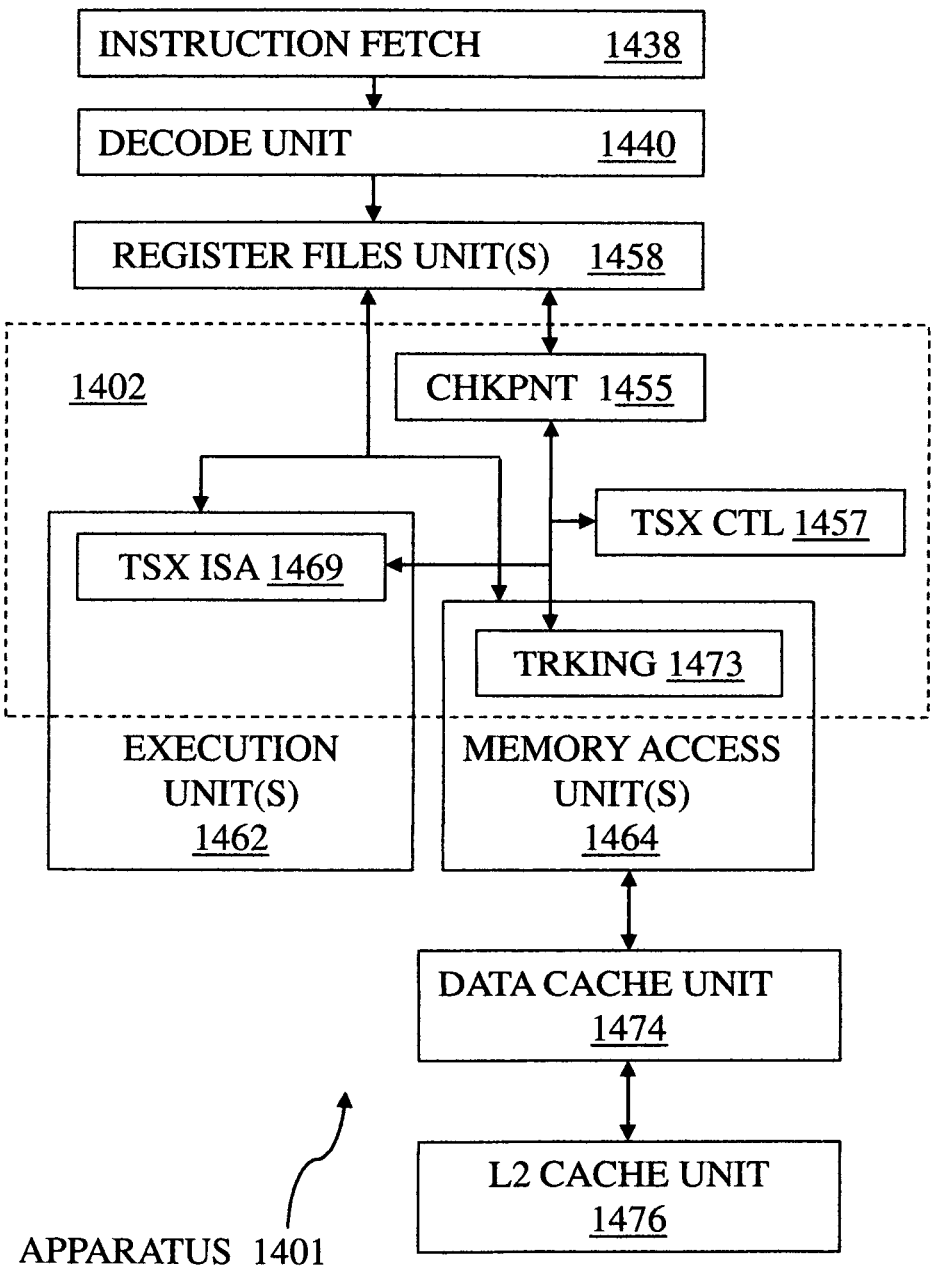
FIG. 14 illustrates one embodiment of an apparatus to provide functionality for testing transactional execution status.

FIG. 14 illustrates one embodiment of an apparatus 1401 to provide functionality for testing transactional execution status. Apparatus 1401 includes an instruction fetch unit 1438, which is coupled to a decode unit 1440. The decode unit or decoder may decode instructions, and generate as an output one or more micro-operations, micro-code entry points, microinstructions, other instructions, or other control signals, which are decoded from, or which otherwise reflect, or are derived from, the original instructions. The decoder may be implemented using various different mechanisms. Examples of suitable mechanisms include, but are not limited to, look-up tables, hardware implementations, programmable logic arrays (PLAs), microcode read only memories (ROMs), etc. The decode unit 1440 is coupled to register files unit(s) 1458.

Each of the register file(s) units 1458 represents one or more physical register files, different ones of which store one or more different data types, such as scalar integer, scalar floating point, packed integer, packed floating point, vector integer, vector floating point, etc., status (e.g., an instruction pointer that is the address of the next instruction to be executed), etc. The register file(s) unit(s) 1458 is coupled with checkpoint logic 1455 of apparatus 1402. Generally, the architectural registers are visible from the outside of the processor or from a programmer's perspective. In one embodiment, checkpoint logic 1455 is provided to checkpoint the set of architecture registers in register file(s) unit(s) 1458 for threads executed by thread processing elements associated with transactional regions of shared memory. The registers are not limited to any known particular type of circuit. Various different types of registers are suitable as long as they are capable of storing and providing data as described herein. Examples of suitable registers include, but are not limited to, dedicated physical registers, dynamically allocated physical registers using register renaming, combinations of dedicated and dynamically allocated physical registers, etc. The register file(s) unit(s) 1458 are coupled to a set of one or more execution unit(s) 1462 and a set of one or more memory access unit(s) 1464. The execution unit(s) 1462 may perform various operations (e.g., shifts, addition, subtraction, multiplication) and on various types of data (e.g., scalar floating point, packed integer, packed floating point, vector integer, vector floating point). While some embodiments may include a number of execution units dedicated to specific functions or sets of functions, other embodiments may include only one execution unit or multiple execution units that all perform all functions. The register file(s) unit(s) 1458, memory access unit(s) 1464 and execution unit(s) 1462 are shown as being possibly plural because certain embodiments create separate pipelines for certain types of data/operations (e.g., a scalar integer pipeline, a scalar floating point/packed integer/packed floating point/vector integer/vector floating point pipeline, and/or a memory access pipeline that each have their own register file(s) unit, and/or execution unit, and in the case of separate memory access pipeline(s), certain embodiments are implemented in which only one or more particular pipeline(s) has the memory access unit(s) 1464). It should also be understood that where separate pipelines are used, one or more of these pipelines may be out-of-order issue/execution and others may be in-order.

The set of memory access units 1464 is coupled to a data cache unit 1474, which is coupled to a level 2 (L2) cache unit 1476. In one exemplary embodiment, the memory access units 1464 may include a load unit, a store address unit, and a store data unit, each of which is coupled to the data cache unit 1474 and tracking logic 1473 of apparatus 1402 to track memory accesses from thread processing elements associated with transactional regions of shared memory in data cache unit 1474. The L2 cache unit 1476 is coupled to one or more other levels of cache and eventually to a main memory.

By way of example, the exemplary apparatus 1401 may implement the pipeline 400 as follows: 1) the instruction fetch 1438 performs the fetch and length decoding stages 402 and 404; 2) the decode unit 1440 performs the decode stage 406; 3) the register file(s) unit(s) 1458 and the memory access unit(s) 1464 perform the register read/memory read stage 414; 4) the execution unit(s) 1462 perform the execute stage 416; and 5) the memory access unit(s) 1464 and the physical register file(s) unit(s) 1458 perform the write back/memory write stage 418.

The apparatus 1401 may support one or more instructions sets (e.g., the x86 instruction set (with some extensions that have been added with newer versions, including the TSX ISA 1469); the MIPS instruction set of MIPS Technologies of Sunnyvale, Calif. (including transactional synchronizations such as in the TSX ISA 1469); the ARM instruction set (with optional additional extensions such as NEON, and including transactional synchronizations such as in the TSX ISA 1469) of ARM Holdings of Sunnyvale, Calif.).

It should be understood that apparatus 1401 can support multithreading (executing two or more parallel sets of operations or threads), and may do so in a variety of ways including time sliced multithreading, simultaneous multithreading (where a single physical core provides a logical core for each of the threads that physical core is simultaneously multithreading), or a combination thereof (e.g., time sliced fetching and decoding and simultaneous multithreading thereafter such as in the Intel® Hyperthreading technology).

For one embodiment, execution unit(s) 1462 executes a TSX instruction set architecture (ISA) 1469 to perform transactional synchronizations coordinated by TSX control 1457. The TSX control 1457 of apparatus 1402 works with checkpoint logic 1455 to checkpoint the set of architecture registers in register file(s) unit(s) 1458, and tracking logic 1473 in memory access unit(s) 1464 to track memory accesses from thread processing elements associated with transactional regions of shared memory in data cache unit 1474. If read/write conflicts occur the architectural state may be rolled back to a previous synchronization point and the conflicting accesses are not committed. For one embodiment TSX ISA 1469 of apparatus 1402 includes one or more instruction (for example the XTEST instruction(s) described above) executable by execution unit(s) 1462 to provide functionality for testing transactional execution status in the thread processing elements.

By including the TSX ISA 1469 in the instruction set of a general-purpose processor core, along with associated logic to execute the instructions, the operations used by many multithreaded applications may be performed using restricted transactional memory or hardware lock elision using apparatus 1401 in a general-purpose processor core. Thus, many multithreaded applications can be accelerated and executed more efficiently by using the restricted transactional memory or hardware lock elision for performing synchronization on shared data. As described above, when thread processing elements are executing transactionally, the tracking logic 1473 in memory access unit(s) 1464 tracks memory accesses from thread processing elements associated with transactional regions of shared memory in data cache unit 1474. This can eliminate the need to perform unnecessary synchronization on critical sections of shared memory that have relatively few conflicts.

Figure 15:
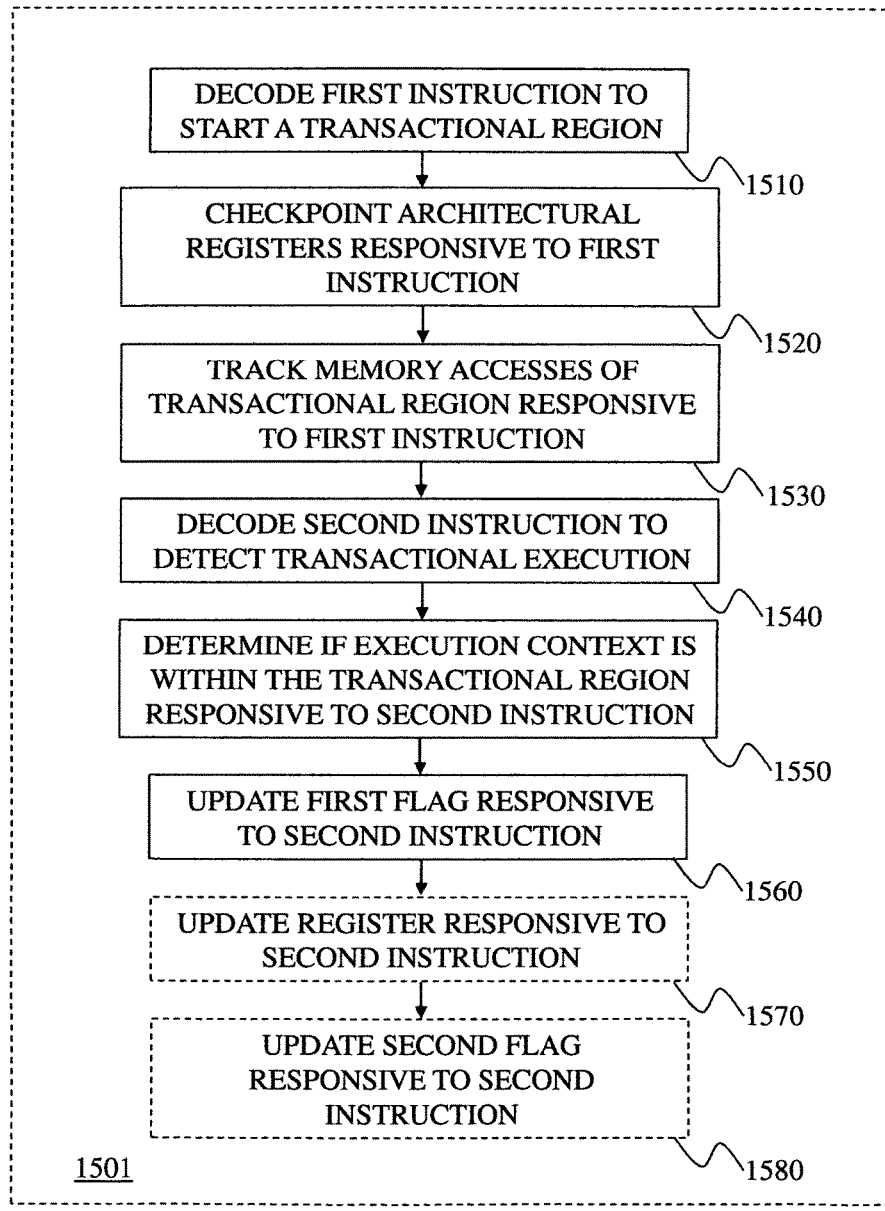
FIG. 15 illustrates a flow diagram for one embodiment of a process to provide functionality for testing transactional execution status.

FIG. 15 illustrates a flow diagram for one embodiment of a process 1501 to provide functionality for testing transactional execution status. Process 1501 and other processes herein disclosed are performed by processing blocks that may comprise dedicated hardware or software or firmware operation codes executable by general purpose machines or by special purpose machines or by a combination of both.

In processing block 1510 of process 1501, a first instruction or prefix to start a transactional region (e.g. for RTM or HLE) is decoded. Responsive to decoding the first instruction, a checkpoint for a set of architecture state registers is generated in processing block 1520. Also responsive to decoding the first instruction, memory accesses from a processing element in the transactional region associated with the first instruction are tracked in processing block 1530. In processing block 1540 a second instruction to detect transactional execution of the transactional region (e.g. one of the XTEST instructions) is decoded. In processing block 1550 an operation is executed, responsive to decoding the second instruction, to determine if an execution context of the second instruction is within the transactional region. Then responsive to the second instruction, a first flag is updated in processing block 1560 (e.g. to zero if the execution context of the second instruction is within the transactional region, or to one otherwise). Further responsive to the second instruction, a register is optionally updated (e.g. as in XTEST.NL or as in XTEST.BA, etc.) in processing block 1570. And in processing block 1580, a second flag is optionally updated responsive to the second instruction (e.g. as in XTEST.BV or XTEST.MV or XTEST.BM).

It will be appreciated that while the process 1501 and other processes herein disclosed are illustrated sequentially, the operations of processing blocks may be performed in various different orders and/or in parallel with each other or continually in some alternative embodiments.

Figure 16:
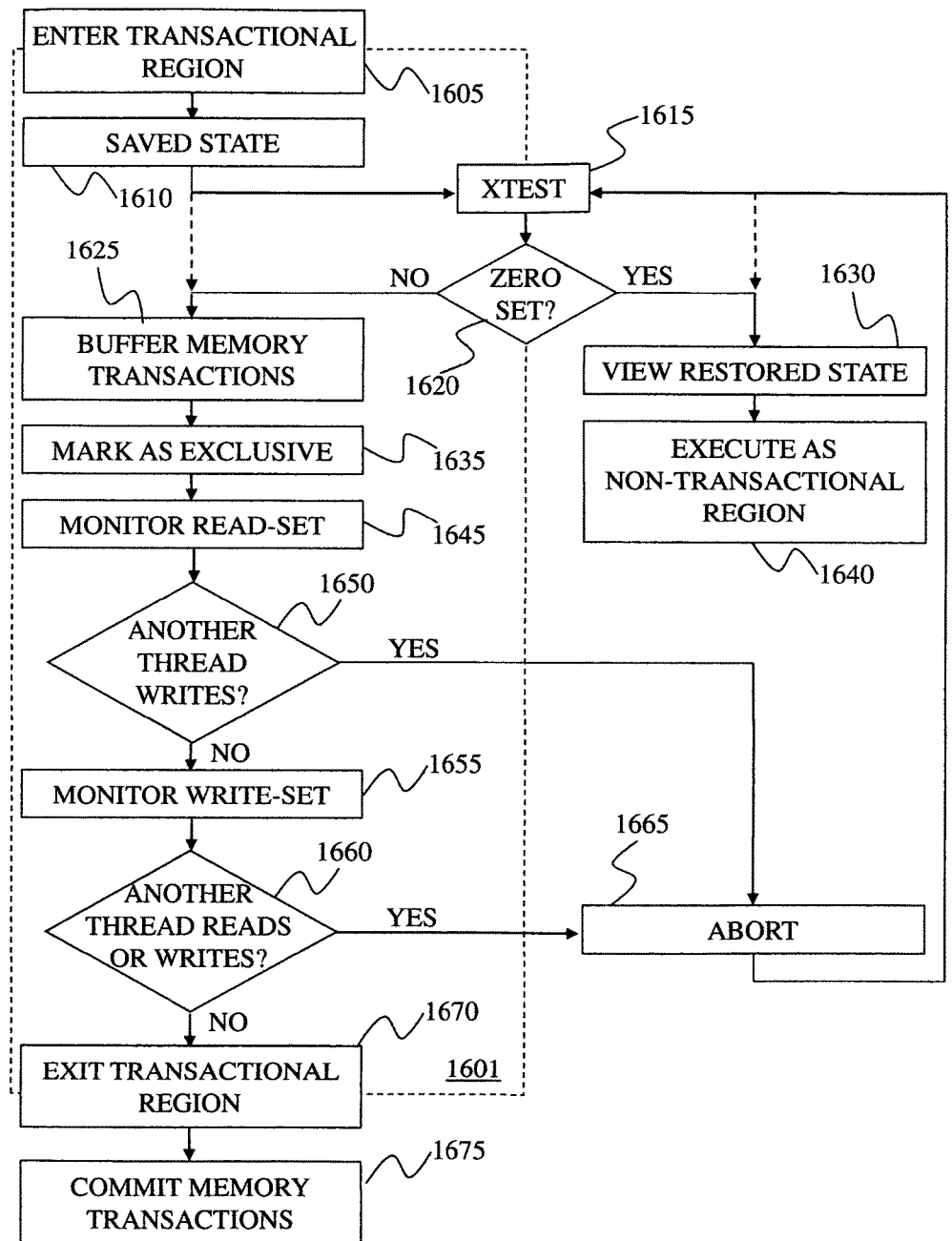
FIG. 16 illustrates a flow diagram for an alternative embodiment of a process to provide functionality for testing transactional execution status.

FIG. 16 illustrates a flow diagram for an alternative embodiment 1601 of a process to support testing transactional execution status. In processing block 1605 the transactional region 1601 is entered (e.g. by encountering an XACQUIRE prefix or an XBEGIN instruction). In processing block 1610, the architectural registers and state are saved. At this point if the XTEST instruction is executed in processing block 1615, then the test at processing block 1620 would determine that the zero flag was not set as a result of the XTEST instruction being executed within the transactionally executing region 1601 in processing block 1615. It will be understood that the flow diagram of FIG. 16 is just an example, and that a programmer may execute the XTEST instruction of processing block 1615 at any point in the process.

Moving on to processing block 1625, memory transactions are buffered as a result of transactionally executing region 1601. In processing block 1635, buffered memory locations may be marked as exclusive, for example in the data cache(s). A read-set is monitored in processing block 1645. If in processing block 1650 another executing thread writes to a monitored memory location of the read-set, then transactional processing is aborted in processing block 1665 (referred to as a transactional abort) and the processor will begin to roll back the execution to a previous synchronization point, for example, the saved state of processing block 1610. On the other hand, when no other executing thread writes to a monitored memory location of the read-set in processing block 1650, a write-set is also being monitored concurrently according to any read/write transactions in processing block 1655. If in processing block 1660 another executing thread reads or writes to a monitored memory location of the write-set, then transactional processing is also aborted in processing block 1665. It will be appreciated that such monitoring is an ongoing process, maintained continually in a manner very similar to cache coherency maintenance. When no other executing threads write to a monitored memory location of the read-set in processing block 1650 and no other executing threads read or write to a monitored memory location of the write-set in processing block 1660 prior to reaching the end of the transactional region, then in processing block 1670 the transactional region 1601 is exited in processing block 1670 (e.g. by encountering an XRELEASE prefix or an XEND instruction) and the buffered memory transactions are atomically committed in processing block 1675 such that they may be observed by other executing threads.

Following a transactional abort in processing block 1665, the processor will roll back the execution to a previous synchronization point, thereby restoring the saved architectural registers and state and discarding any uncommitted memory transactions. At this point if the XTEST instruction is executed in processing block 1615, then the test at processing block 1620 would determine that the zero flag was set as a result of the XTEST instruction being executed in processing block 1615 following a transactional abort in processing block 1665, and consequently not within a transactionally executing region 1601. Therefore in processing block 1630, a program or thread would view the restored or rolled back processor state of a previous synchronization point, and could continue to execute as a non transactional region in processing block 1640. According to embodiments of the XTEST instruction the program may determine whether or not a transactional abort has taken place, which may not otherwise be indicated by processor or memory state.

It will be appreciated that given such observations of whether or not a transactional abort has taken place, such information may provide options to the programmer such as recording and counting the number of retries that ended in a transactional abort. Other options may also be provided to the programmer such as skipping sections of code depending on a determination that the program is or is not currently executing within a transactionally executing region. Other various types of XTEST instructions have also been described, which may provide additional options to the programmer, such as getting an indication prior to a transactional abort that something could go wrong (e.g like running out of buffer space, or some other thread is also issuing transactions to the same memory locations that your thread intends to modify, etc.).

The above description is intended to illustrate preferred embodiments of the present invention. From the discussion above it should also be apparent that especially in such an area of technology, where growth is fast and further advancements are not easily foreseen, the invention may be modified in arrangement and detail by those skilled in the art without departing from the principles of the present invention within the scope of the accompanying claims and their equivalents.

What is claimed is:
1. A system comprising:
a plurality of processors comprising a plurality of multithreaded cores, wherein one or more of the multithreaded cores are to perform out-of-order instruction execution for a plurality of threads, and wherein the one or more of the multithreaded cores comprise:
instruction fetch logic to fetch a plurality of instructions of one or more of the threads,
an instruction decode unit to decode the instructions,
register renaming logic to rename one or more registers for the instructions within a register file, an instruction cache to cache one or more of the instructions to be executed, a data cache to cache data for the instructions, a level 2 (L2) cache unit to cache one or more of the instructions and data for the instructions, checkpoint logic to checkpoint an architectural state responsive to a first instruction among the instructions to initiate a transactional execution region comprising transactional memory operations, transaction tracking logic to determine whether the transactional memory operations of the transactional execution region result in a conflict, wherein the transaction tracking logic is to adjust one or more flags responsive to a determination that a conflict exists, an execution unit to execute a second instruction among the instructions to test a status of the transactional execution region, wherein, to execute the second instruction to test the status of the transactional execution region, the execution unit is further to determine that the second instruction is within a context of the transactional execution region and, in response, set a flag register to a value indicating that the second instruction is within the context of the transactional execution region, and logic to atomically commit the transactional memory operations following a determination that no conflict exists or to roll back to the checkpointed architectural state following the determination that the conflict exists;

a processor interconnect to communicatively couple two or more of the processors; and a system memory comprising a dynamic random access memory communicatively coupled to one or more of the processors.

2. The system of claim 1, further comprising an external cache communicatively coupled to one or more of the processors over an interconnect.

3. The system of claim 1, further comprising an accelerator unit communicatively coupled to one or more of the processors to perform a specified function.

4. The system of claim 3, wherein the accelerator unit comprises a Field Programmable Gate Array.

5. The system of claim 1, further comprising at least one communication device communicatively coupled to one or more of the processors.

6. The system of claim 1, further comprising at least one storage device communicatively coupled to two or more of the processors.

7. The system of claim 1 further comprising:

a shared cache to be shared by two or more of the multithreaded cores.

8. The system of claim 1, wherein the execution unit is further to execute a third instruction among the instructions that indicates an end of the transaction execution region and causes the logic to atomically commit the transactional memory operations or to roll back to the checkpointed architectural state.

9. The system of claim 1, wherein, to execute the second instruction to test the status of the transactional execution region, the execution unit is further to set a register to a value indicating a nesting level of the transactional execution region.

10. The system of claim 1, wherein, to execute the second instruction to test the status of the transactional execution region, the execution unit is further to set a register to a value indicating at least one of a number or a size of available internal buffers for the transactional execution region.

11. The system of claim 1, wherein, to execute the second instruction to test the status of the transactional execution region, the execution unit is further to set a register to a value indicating that a transaction for a specified memory location would overflow internal buffers and cause an abort of the transactional execution region.

12. The system of claim 1, wherein, to execute the second instruction to test the status of the transactional execution region, the execution unit is further to set a register to a value indicating, responsive to the checkpoint logic and the transaction tracking logic, that an access to a specified memory location would conflict with another transactional execution region and cause an abort of the transactional execution region.

* * * * *